US012796122B2

(12) United States Patent
Baik et al.

(10) Patent No.: US 12,796,122 B2
(45) Date of Patent: Nov. 10, 2026

(54) TERAHERTZ WAVE-VISIBLE LIGHT CONVERSION DEVICE AND IMAGE SENSING DEVICE INCLUDING THE SAME

(71) Applicants: SAMSUNG ELECTRONICS CO., LTD., Suwon-si (KR); MASSACHUSETTS INSTITUTE OF TECHNOLOGY, Cambridge, MA (US); REGENTS OF THE UNIVERSITY OF MINNESOTA, Minneapolis, MN (US)

(72) Inventors: Chanwook Baik, Yongin-si (KR); Jiaojian Shi, Newton, MA (US); Keith A. Nelson, Newton, MA (US); Sanghyun Oh, Plymouth, MN (US); Daehan Yoo, Saint Paul, MN (US); Kyungsang Cho, Gwacheon-si (KR)

(73) Assignees: SAMSUNG ELECTRONICS CO., LTD., Suwon-si (KR); MASSACHUSETTS INSTITUTE OF TECHNOLOGY, Cambridge, MA (US); REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 522 days.

(21) Appl. No.: 17/990,475

(22) Filed: Nov. 18, 2022

(65) Prior Publication Data

US 2023/0163154 A1 May 25, 2023

Related U.S. Application Data

(60) Provisional application No. 63/281,335, filed on Nov. 19, 2021.

(30) Foreign Application Priority Data

Jul. 6, 2022 (KR) ........................ 10-2022-0083162

(51) Int. Cl.
*H10F 39/12* (2025.01)
*H10F 39/00* (2025.01)

(52) U.S. Cl.
CPC ....... *H10F 39/191* (2025.01); *H10F 39/8027* (2025.01)

(58) Field of Classification Search
CPC ...... H10F 39/191; H10F 39/8027; G01J 3/04; G01J 3/0245; G01J 3/0216; G01J 3/42;
(Continued)

(56) References Cited

U.S. PATENT DOCUMENTS

| | | | | |
|---|---|---|---|---|
| 8,482,197 B2 * | 7/2013 | Niigaki | ................... | H01J 40/06 313/523 |
| 9,356,170 B2 * | 5/2016 | Brown | .................. | H10F 77/143 |

(Continued)

FOREIGN PATENT DOCUMENTS

| | | |
|---|---|---|
| CN | 109238466 B | 9/2020 |
| CN | 108375556 B | 4/2021 |

(Continued)

OTHER PUBLICATIONS

Kosuke_English, kosuke translation (Year: 2011).*

(Continued)

*Primary Examiner* — Minsun O Harvey
*Assistant Examiner* — Alexander Ehrlich
(74) *Attorney, Agent, or Firm* — Sughrue Mion, PLLC

(57) ABSTRACT

A light conversion device includes a substrate; a plurality of metal patterns provided on the substrate and separated from each other; a metal layer provided on the substrate and surrounding each of the plurality of metal patterns; a first slit positioned between the metal layer and each of the plurality of metal patterns and surrounding each of the plurality of metal patterns; and a light-emitting layer filling the first slit. The first slit and the metal pattern surrounded by the first slit
(Continued)

are concentric. The metal layer and the plurality of metal patterns are aligned so that a first electric field enhancement occurs when a wave belonging to an invisible light band is incident to the first slit.

12 Claims, 39 Drawing Sheets

(58) Field of Classification Search
CPC ........ G01J 5/0815; G01J 5/046; G01J 5/0837; G01J 1/58
See application file for complete search history.

(56) References Cited

U.S. PATENT DOCUMENTS

| | | | | |
|---|---|---|---|---|
| 2016/0258807 | A1* | 9/2016 | Pein | G01J 3/04 |
| 2020/0215842 | A1 | 7/2020 | Muta | |
| 2020/0217789 | A1 | 7/2020 | Muta et al. | |

FOREIGN PATENT DOCUMENTS

| | | | | |
|---|---|---|---|---|
| JP | 2012146758 | A | * | 8/2012 |
| JP | 2013062658 | A | * | 4/2013 |
| JP | 2019-60841 | A | | 4/2019 |

OTHER PUBLICATIONS

Hosoda_English, hosoda translation (Year: 2013).*
Brandt C. Pein et al, "Terahertz-Driven Luminescence and Colossal Stark Effect in in CdSe—CdS Colloidal Quantum Dots", Nano Lett., Aug. 8, 2017, vol. 17, pp. 5375-5380, DOI: 10.1021/acs.nanolett.7b01837.
Nick C. J. van der Valk et al, "Terahertz polarization imaging", Optics Letters, vol. 30, No. 20, Oct. 15, 2005, 3 pages.
Jiaojian Shi et al, "A room-temperature polarization-sensitive CMOS terahertz camera based on quantum-dot-enhanced terahertz-to-visible photon upconversion", nature nanotechnology, Nov. 3, 2022, 8 pages, https://doi.org/10.1038/s41565-022-01243-9.
Jiaojian Shi et al, "A room-temperature polarization-sensitive CMOS terahertz camera based on quantum-dot-enhanced terahertz-to-visible photon upconversion [Supplemental material]", nature nanotechnology, Nov. 3, 2022, 8 pages, https://doi.org/10.1038/s41565-022-01243-9.
D.R. Grischkowsky et al, "Optoelectronic Characterization of Transmission Lines and Waveguides by Terahertz Time-Domain Spectroscopy", IEEE Journal on Selected Topics in Quantum Electronics, vol. 6, No. 6, Nov./Dec. 2000, 14 pages.
Bradley Ferguson et al., "Materials for terahertz science and technology", nature materials, vol. 1, Sep. 2002, 8 pages, www.nature.com/naturematerials.
Denis A. Bandurin et al., "Resonant terahertz detection using graphene plasmons", Nature Communications, vol. 9, No. 5392, Dec. 19, 2018, https://doi.org/10.1038/s41467-018-07848-w.

* cited by examiner

TERAHERTZ WAVE-VISIBLE LIGHT CONVERSION DEVICE AND IMAGE SENSING DEVICE INCLUDING THE SAME

CROSS-REFERENCE TO RELATED APPLICATIONS

This application claims the benefit of U.S. Provisional Application No. 63/281,335, filed on Nov. 19, 2021, in the US Patent Office and Korean Patent Application No. 10-2022-0083162, filed on Jul. 6, 2022, in the Korean Intellectual Property Office, the disclosures of which are incorporated herein in their entireties by reference.

BACKGROUND

1. Field

The disclosure relates to devices for converting invisible light into visible light and its applications, and more particularly, to a terahertz wave-visible light conversion device and an image sensing device including the same.

2. Description of the Related Art

A conventional terahertz wave detection device may use photons, thermal rectification, and a heterodyne method according to a detection principle, and may be used for a spectroscopic and imaging system configuration.

A photo-conductive antenna method that is used in a typical terahertz wave detector (having a structure in which a broadband antenna is formed on a Group III-V semiconductor) generates electron-hole pairs inside a photoconductive layer using ultrafast femtosecond pulsed laser. When using this method, an electron-hole pair is separated and accelerated by an incident terahertz wave, and is detected as a photocurrent. For detecting a signal in a terahertz band, low-temperature grown GaAs or InGaAs having high mobility and a charge lifetime of 1 ps (picosecond) or less is used for high-speed operation of the terahertz wave detection device.

A conventional superconductor-based terahertz wave detector may have a sandwich structure (Superconductor-Insulator-Superconductor (SIS)) in which a thin insulating layer with a thickness of about 2 nm is formed between two superconductors. In the conventional superconductor-based terahertz wave detector, a terahertz wave is measured by measuring a tunneling current of quasi-particles generated by electromagnetic waves having photon energy greater than or equal to a binding energy of a Cooper pair in the superconductor. Because the size of the binding energy of the Cooper pair is only $10^{-3}$ to $10^{-2}$ of a semiconductor energy gap, it is suitable for the detection of terahertz waves, but requires a measurement environment at a cryogenic temperature (several K) which can be difficult and/or expensive to maintain.

A bolometer, operates by measuring changes in electrical resistance (electric conductivity) that appear according to changes in a lattice or electron temperature of an absorber by an incident wave, and may utilize a non-cooling method or a cooling method depending on the operating temperature. Because a single-type micro-bolometer method is based on conventional silicon-based MEMS technology, it is easy to arrange and integrate, may be operated at room temperature, and thus may be suitable for real-time imaging and spectroscopy in a band of 3 THz or higher.

SUMMARY

Provided are terahertz wave detection devices capable of detecting a terahertz wave at a high speed while having a relatively high sensitivity.

Provided are image sensing devices capable of easily acquiring information on a polarization state of a terahertz wave by including the terahertz wave detection devices.

Additional aspects will be set forth in part in the description which follows and, in part, will be apparent from the description, or may be learned by practice of the presented embodiments of the disclosure.

A light conversion device may include a substrate; a plurality of metal patterns provided on the substrate and separated from each other; a metal layer provided on the substrate and surrounding each of the plurality of metal patterns; a first slit positioned between the metal layer and each of the plurality of metal patterns and surrounding each of the plurality of metal patterns; and a light-emitting layer filling the first slit. The first slit and the metal pattern surrounded by the first slit may be concentric. The metal layer and the plurality of metal patterns may be aligned so that a first electric field enhancement occurs when a wave belonging to an invisible light band is incident to the first slit.

The light-emitting layer may extend onto the metal layer and the plurality of metal patterns.

The light-emitting layer may include at least one of quantum dots or an organic light-emitting diode (OLED) material.

The first slit may define a side surface substantially perpendicular or inclined with respect to the substrate.

Each of the plurality of metal patterns (i) may be arranged to form a second slit in which a second electric field enhancement occurs when a wave of an invisible light band is incident to the second slit, and (ii) may include a first metal portion and a second metal portion that are separated from each other. The second metal portion may completely surround the first metal portion. The second slit (i) may be present between the first metal portion and the second metal portion, (ii) may be filled with the light-emitting layer, and (iii) may have a width configured to generate visible light from the light-emitting layer by the second electric field enhancement.

The second slit may define a side surface substantially perpendicular or inclined with respect to the substrate.

The light-emitting layer may extend onto the first and second metal portions.

Each of the plurality of metal patterns (i) may be arranged to form a second slit and a third slit in which a second electric field enhancement and a third electric field enhancement respectively occur when a wave of an invisible light band is incident to the second slit and the third slit respectively, and (ii) may include a first metal portion, a second metal portion, and a third metal portion separated from each other. The first metal portion, the second metal portion, and the third metal portion may be concentric circles and may be sequentially provided in a radial direction. The second slit may be positioned between the first metal portion and the second metal portion. The third slit may be positioned between the second metal portion and the third metal portion. The second slit and third slit (i) may be filled with the light-emitting layer and (ii) may each have a respective width configured to generate visible light from the light-emitting layer by the second electric field enhancement and the third electric field enhancement.

Each of the first slit, the second slit, and the third slit may have a same width as each other.

The first slit, the second slit, and the third slit respectively may have a first width, a second width, and a third width. At least two from among the first width, the second width and the third width may be different from each other.

The first slit, the second slit, and the third slit may each define a side surface substantially perpendicular to or inclined to the substrate.

The light-emitting layer may completely fill each of the first slit, the second slit, and the third slit and extend onto the first metal portion, the second metal portion, and the third metal portion.

A light conversion device may include a substrate; a first metal layer formed on the substrate and including a plurality of first through holes separated from each other; a second metal layer provided in the plurality of first through holes and separated from the first metal layer; and a light-emitting layer filling a first gap between the first metal layer and the second metal layer. The first gap may have a first width configured to generate a first electric field enhancement according to a polarization state of a wave when the wave belonging to an invisible light band is incident.

A side surface of the first metal layer and a side surface of the second metal layer each defined by the first gap may be substantially perpendicular or inclined to the substrate.

The light-emitting layer may extend onto the first metal layer and the second metal layer.

The second metal layer may include a second through hole through which the substrate is exposed; and a third metal layer formed on the substrate in the second through hole and separated from the second metal layer. A second gap between the second metal layer and the third metal layer may be filled with the light-emitting layer. The second gap may have a second width configured to generate a second electric field enhancement according to a polarization state of the wave when the wave is incident.

The light-emitting layer may extend onto the first metal layer, the second metal layer and the third metal layer.

The third metal layer may include a third through hole through which the substrate is exposed; and a fourth metal layer formed on the substrate in the third through hole and separated from the third metal layer. A third gap between the third metal layer and fourth metal layer may be filled with the light-emitting layer. The third gap may have a third width configured to generate a third electric field enhancement according to a polarization state of the wave when the wave is incident.

The light-emitting layer may onto the first metal layer, the second metal layer and the fourth metal layer.

An image sensing device may include a light conversion device and an image sensor configured to sense visible light emitted from the light conversion device. The light conversion device may include a substrate; a plurality of metal patterns provided on the substrate and separated from each other; a metal layer provided on the substrate and surrounding each of the plurality of metal patterns; a first slit positioned between the metal layer and each of the plurality of metal patterns and surrounding each of the plurality of metal patterns; and a light-emitting layer filling the first slit. The first slit and the metal pattern surrounded by the first slit may be concentric, and the metal layer and the plurality of metal patterns may be aligned so that a first electric field enhancement occurs when a wave belonging to an invisible light band is incident to the first slit. The image sensing device may be used to detect a polarization state of invisible light.

The invisible light band may have a frequency of less than 100 THz.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6A is a cross-sectional view taken along line 6-6' of FIG. 6B.

DETAILED DESCRIPTION

Figure 1:
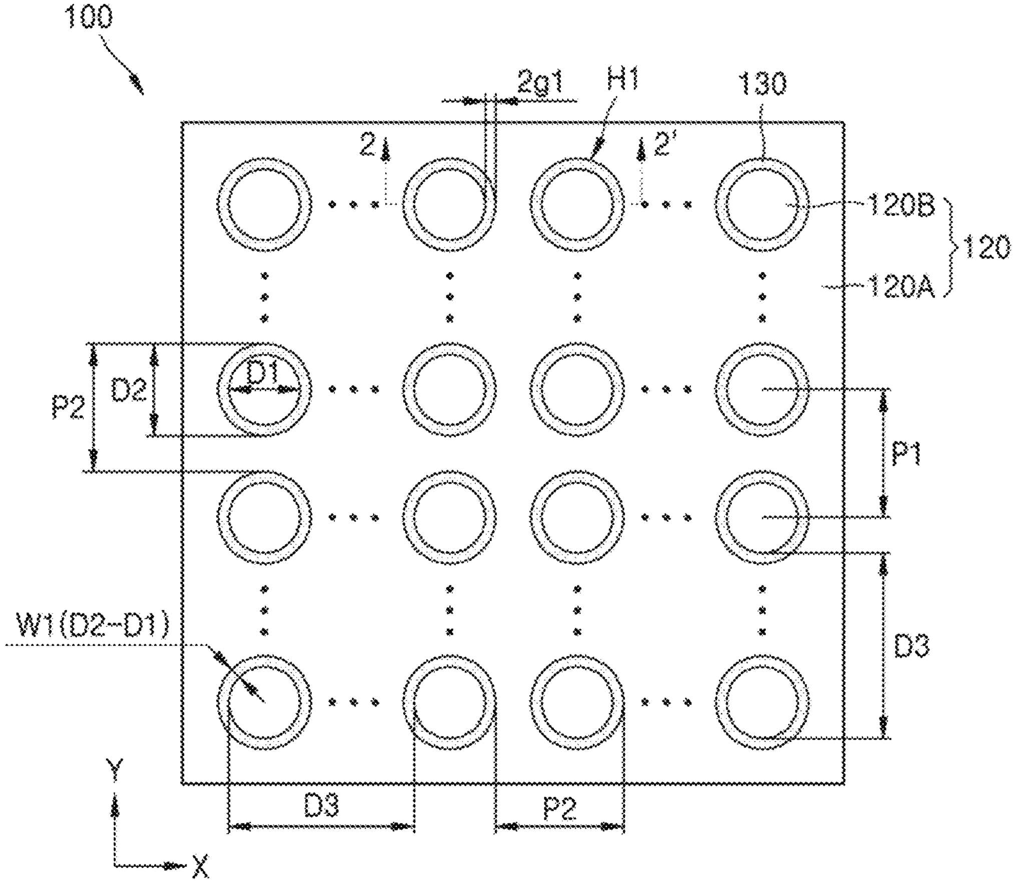
FIG. 1 is a plan view showing a first terahertz wave-visible light conversion device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. The embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a terahertz wave-visible light conversion device and an image sensing device including the same according to various embodiments will be described in detail with reference to the accompanying drawings. The drawings are not to scale, and thicknesses of layers and regions may be exaggerated for clarification of the specification. The following embodiments described below are merely illustrative, and various modifications may be possible from the embodiments of the present disclosure. In the layer structures, when an element or layer is referred to as being "on" or "above" another element or layer, the element or layer may be directly on another element or layer or intervening elements or layers. In the drawings, like reference numerals are used to indicate like elements.

First, a terahertz wave-visible light conversion device according to an embodiment is described.

FIG. 1 is a plan view showing a first terahertz wave-visible light conversion device 100 according to an embodiment.

As used in this disclosure, a "terahertz wave-visible light conversion device" may refer to a device that converts a terahertz wave into visible light, and not that converts visible light into a terahertz wave. Accordingly, the "terahertz wave-visible light conversion device" may be expressed as a visible light-emitting device using a terahertz wave.

In addition, because a terahertz wave is a wave outside of the visible light band and is therefore invisible light, the "terahertz wave-visible light conversion device" may be expressed as a device for converting invisible light into visible light or a light conversion device.

In some embodiments, a range of the terahertz waves may be 100 THz or less, for example, 50 THz or less or in a range from about 0.3 THz to about 30 THz, but may not be limited thereto.

Figure 2:
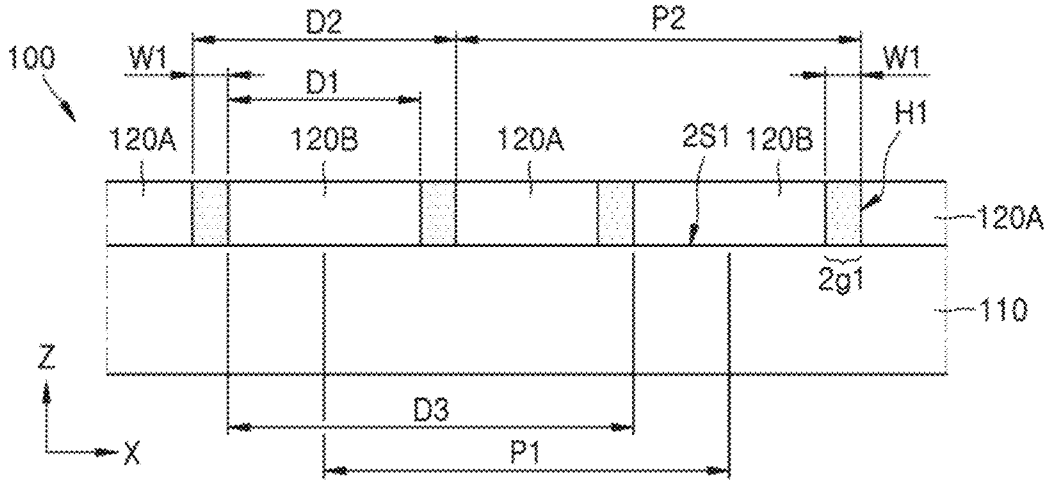
FIG. 2 is a cross-sectional view taken along line 2-2' of FIG. 1.

FIG. 2 is a cross-sectional view taken along line 2-2' of FIG. 1.

Referring to FIGS. 1 and 2 together, the first terahertz wave-visible light conversion device 100 may include a substrate 110, a metal layer 120 formed on the substrate 110, and a light-emitting layer 130 distributed in the metal layer 120. The substrate 110 may include a substrate transparent to incident light. In some embodiments, the substrate 110 may include a glass substrate or a quartz substrate. The metal layer 120 may include a plurality of metal patterns 120A and 120B separated from each other. In some embodiments, the metal layer 120 may include one first metal pattern 120A and a plurality of second metal patterns 120B. The first metal pattern 120A is separated from the plurality of second metal patterns 120B. The plurality of second metal patterns 120B may be separated from each other. Each of the plurality of second metal patterns 120B may be surrounded by the first metal pattern 120A. The plurality of second metal patterns 120B may be formed only on a partial region (hereinafter, referred to as a first region) of one surface 2S1 of the substrate 110, and the first metal pattern 120A may be provided to entirely cover a second region of the one surface 2S1 of the substrate 110. The second region may be a region other than the first region of the one surface 2S1 of the substrate 110. The one surface 2S1 of the substrate 110 may be an upper surface, but may be a lower surface or a side surface depending on the viewpoint, and may be a flat surface or an inclined surface. The plurality of second metal patterns 120B may be arranged in a horizontal direction (e.g., X-axis direction) and a vertical direction (e.g., Y-axis direction) as shown in FIG. 1. Alignment intervals in the horizontal and vertical directions of the plurality of second metal patterns 120B may be constant, but may not be constant. For example, the plurality of second metal patterns 120B may be arranged at regular first intervals in any one of the horizontal and vertical directions, but may not be arranged at regular intervals in other directions or may be arranged at a second interval that is different from the first interval.

Because the first metal pattern 120A and the plurality of second metal patterns 120B are separated from each other, there may be a gap **2*g*1 between the first metal pattern 120A and the plurality of second metal patterns 120B. Each of the second metal patterns 120B may be completely surrounded by the gap 2*g*1. A width W1 of the gap 2*g*1 around each of the second metal patterns 120B may be constant. In other words, each of the second metal patterns 120B may be completely surrounded by the gap 2*g*1 having a constant width W1. In some embodiments, the gap 2*g*1 may be less than a first diameter D1 of the second metal pattern 120B. In some embodiments, the width W1 of the gap 2*g*1 may be several micrometers (μm) or less. For example, the width W1 may be several nanometers (nm) to several hundred nanometers, or 1 micrometer or less or 2 micrometers or less. The first diameter D1 of the second metal pattern 120**B may be on the order of several tens of nanometers to several hundred micrometers.

The first metal pattern 120A may include a plurality of through holes H1 in the same number as the number of second metal patterns 120B. The plurality of through holes H1 may correspond the plurality of second metal patterns 120B one-to-one. One second metal pattern 120B may be in each through hole H1. Each through hole H1 may be formed to have a second diameter D2. The second diameter D2 may be greater than the first diameter D1. A difference (D2−D1) between the second diameter D2 and the first diameter D1 may correspond to the width W1 of the gap **2*g*1. In an example embodiment, the center of the through hole H1 may be the same as the center of the second metal pattern 120B. In other words, the center of the through hole H1 and the center of the second metal pattern 120B may coincide with each other. As described above, because the through hole H1 and the second metal pattern 120B have the same center, it may be stated that the through hole H1 and the second metal pattern 120**B are concentric.

Because the through hole H1 and the second metal pattern 120B may be concentric circles, the gap **2*g*1 around the second metal pattern 120B may also be concentric. And, because the width W1 of the gap 2*g*1 may be at a nanometer level, the gap 2*g*1** may be regarded as a ring-shaped nano-structure or a nano-coax structure, and may be regarded as a nano-slit having a nano-coax structure.

As a result, the first and second metal patterns 120A and 120B on the substrate 110 may be provided to form a nano-coax structure.

In some embodiments, a geometric shape of each of the second metal patterns 120B on a plane may be circular, but is not limited thereto. For example, the geometric shape of each of the second metal patterns 120B may be non-circular, or may be a polygonal (e.g., quadrangular, etc.) shape.

In some embodiments, the metal layer 120 may include a conductive material, for example, at least one of Au, Al, W, Pt, Mo, Cr, Ti, TiN, AlN, AlNd, Ni and Cu, but is not limited thereto. In some embodiments, the metal layer 120 may be a graphene layer or may include graphene. In some embodiments, the material of the first metal pattern 120A may be the same as that of the second metal pattern 120B, but the materials thereof may be different from each other.

The plurality of second metal patterns 120B may be aligned or arranged to have a first pitch P1 in a horizontal direction (e.g., X-axis direction) and/or a vertical direction (e.g., Y-axis direction). The first pitch P1 may correspond to a distance between the centers of two adjacent second metal patterns 120B, but the pitches of the plurality of second metal patterns 120B may be expressed or defined differently. For example, a distance between each starting point of two adjacent second metal patterns 120B arranged in the same direction (e.g., a first direction) may be a third distance D3, and the third distance D3 may be referred to as a pitch of the plurality of second metal patterns 120B. The first direction may be an X-axis direction or a Y-axis direction. The first diameters D1 of the plurality of second metal patterns 120B may be equal to or substantially equal to each other. Also, in the plurality of second metal patterns 120B, intervals between the second metal patterns 120B adjacent to each other in the horizontal and vertical directions may be the same or substantially the same. Accordingly, a distance between the end points of each of two adjacent second metal patterns 120B aligned in the same direction among the plurality of second metal patterns 120B may be equal to the third distance D3.

In some embodiments, the plurality of through-holes H1 may be aligned or arranged to have a second pitch P2 in the horizontal and/or vertical directions. In some embodiments, the second pitch P2 may correspond to a distance between the centers of two adjacent through-holes H1. Accordingly, the second pitch P2 may be equal to or substantially equal to the first pitch P1. In some embodiments, a distance between the plurality of through holes H1 in the first direction and/or the second direction may be greater than an interval (D2−D1) between the first metal pattern 120A and the second metal pattern 120B, that is, the width W1 of the gap **2*g*1. In some embodiments, the interval of the plurality of through holes H1 in the first and/or second direction may be the same as or substantially the same as the first diameter D1 of the second metal pattern 120B, or may be less than the first diameter D1**. The first direction and the second direction may be perpendicular to or substantially perpendicular to each other. In some embodiments, one of the first and second directions may be in the X-axis direction or substantially parallel to the X-axis direction, and the other may be in the Y-axis direction or substantially parallel to the Y-axis direction.

In some embodiments, the light-emitting layer 130 includes a light-emitting material that fills the gap **2*g*1 between the first metal pattern 120A and the second metal pattern 120B. Accordingly, the light-emitting layer 130 may be expressed as a light-emitting material layer. Because the gap 2g1 is a partial region of the through hole H1, the partial region of the through hole H1 may be expressed as being filled with the light-emitting layer 130. In other words, it may be expressed that a partial region of the through hole H1 may be filled with the light-emitting layer 130, and the remaining area may be filled with the second metal pattern 120**B.

In some embodiments, the gap 2g1 may be completely filled with the light-emitting layer 130. In other words, the through hole H1 between the first metal pattern 120A and the second metal pattern 120B may be completely filled with the light-emitting layer 130.

Figure 3:
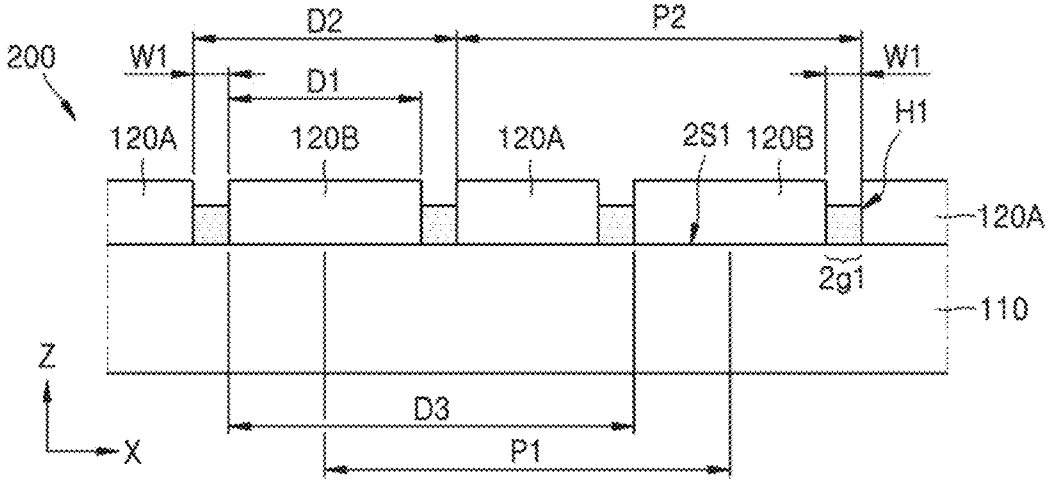
FIG. 3 is a cross-sectional view illustrating a case in which a gap in FIG. 2 is not completely filled with a light-emitting (a second terahertz wave-visible light conversion device)

In some embodiments, as in the case of a second terahertz wave-visible light conversion device 200 illustrated in FIG. 3, only a partial region of the gap 2g1 may be filled with the light-emitting layer 130. In some embodiments, the light-emitting layer 130 may fill ⅓ or less, ½ or less, or ⅔ or less of the through hole H1 between the first metal pattern 120A and the second metal pattern 120B, and may also fill ⅔ or more of the through hole H1.

Figure 4:
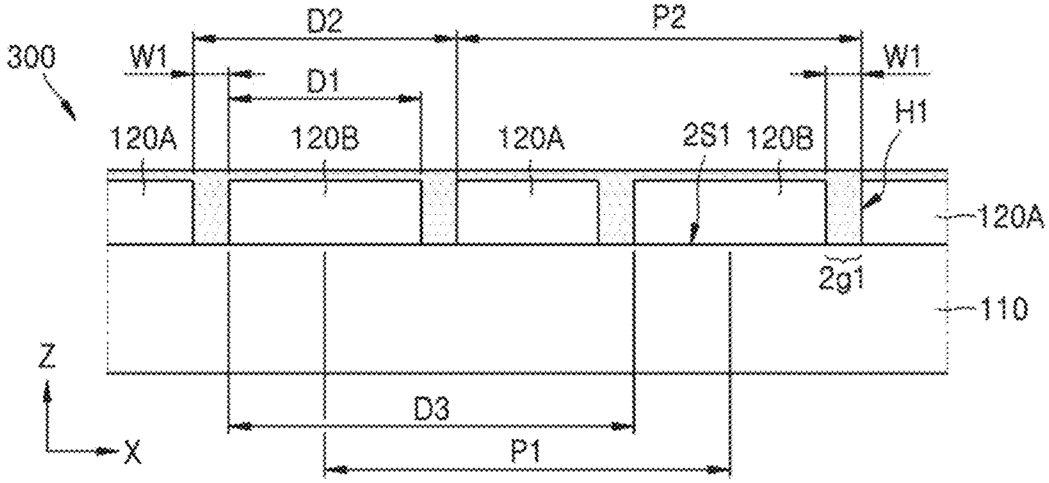
FIG. 4 is a cross-sectional view illustrating a case in which a gap is completely filled with a light-emitting layer in FIG. 2 and the light-emitting layer extends onto a metal pattern adjacent to the gap (a third terahertz wave-visible light conversion device)

In some embodiments, as in the case of a third terahertz wave-visible light conversion device 300 shown in FIG. 4, the light-emitting layer 130 may completely fill the gap 2g1, and then, extend onto the first and second metal patterns 120A and 120B adjacent to the gap 2g1. In some embodiments, the light-emitting layer 130 may extend to cover the entire upper surface of the first and second metal patterns 120A and 120B. A thickness of the light-emitting layer 130 on the upper surfaces of the first and second metal patterns 120A and 120B may be uniform.

In some embodiments, the light-emitting layer 130 may be or include an electroluminescence layer. In some embodiments, the light-emitting layer 130 may be a quantum dot layer formed of quantum dots or may include quantum dots. In some embodiments, the quantum dots may include a Group II-VI series compound, a Group III-V series compound, and/or a Group IV-VI series compound, but are not limited thereto.

In some embodiments, the Group II-VI series compound may include CdSe, CdTe, CdS, or ZnSe, but is not limited thereto. In some embodiments, the Group III-V compound may include InP, InAs, or InSb, but is not limited thereto. In some embodiments, the Group IV-VI series compound may include PbS or PbSe, but is not limited thereto.

In some embodiments, the quantum dot may include only a single core, but may have a core-shell structure including a core and a shell surrounding the core.

The shell may be expressed as a shell layer, and may completely cover the entire core. The core and the shell may be in direct contact with each other. In the core-shell structure, the core may include a first quantum dot material, and the shell may include a second quantum dot material. "Quantum dot material" may refer to a material forming a quantum dot or a material of the quantum dot. In some embodiments, the first quantum dot material may include a Group II-VI series compound, a Group III-V series compound, and/or a Group IV-VI series compound, but is not limited thereto. In some embodiments, the second quantum dot material may include a Group II-VI series compound, a Group III-V series compound, and/or a Group IV-VI series compound, but may be different from the first quantum dot material. In some embodiments, the second quantum dot material may include CdS, CdTe, or ZnS, but is not limited thereto.

Figure 5A:
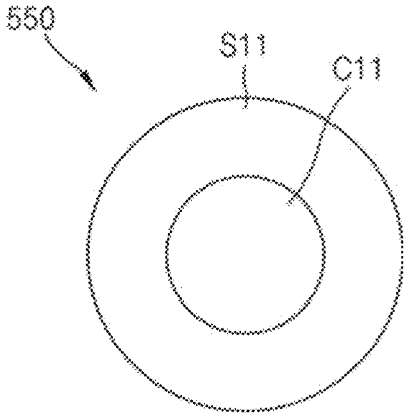
FIGS. 5A and 5B are a cross-sectional views illustrating various examples of quantum dots having a core-shell structure when the light-emitting layer filling the gap of FIG. 2 is a quantum dot having a core-shell structure.
Figure 5B:
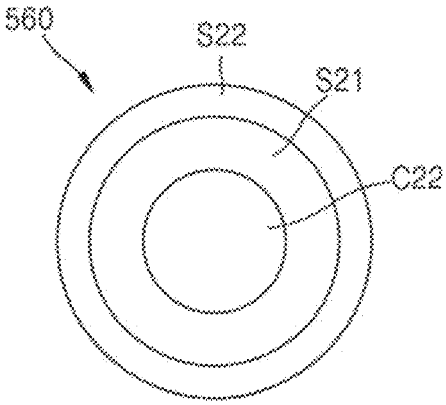

FIGS. 5A and 5B shows various quantum dots having a core-shell structure.

For example, FIG. 5A shows a first quantum dot 550 having a first core-shell structure, and FIG. 5B shows a second quantum dot 560 having a second core-shell structure.

The first quantum dot 550 may include a first core C11 and a first shell S11. The first shell S11 may surround the entire first core C11 and may be in direct contact with the first core C11. The first shell S11 may be a single layer. A thickness of the first shell S11 may be constant or substantially constant. The second quantum dot 560 may include a second core C22, a first shell S21, and a second shell S22. The first shell S21 may completely surround the second core C22 and is in contact with the second core C22. A thickness of the first shell S21 may be constant or substantially constant. The second shell S22 may surround both the second core C22 and the first shell S21. The second shell S22 may be formed on a surface of the first shell S21, may cover the entire outer surface of the first shell S21, and may be in direct contact with the entire outer surface of the first shell S21. A thickness of the second shell S22 may be constant or substantially constant. In some embodiments, the thicknesses of the first and second shells S21 and S22 may be the same as or different from each other.

In some embodiments, the material of the first core C11 and the material of the second core C22 may be the same, but the materials thereof may be different from each other. In some embodiments, the material of the first and second cores C11 and C22 may include the first quantum dot material described above. In some embodiments, the material of the first shell S11 of the first quantum dots 550 may be different from the material of the first core C11. The material of the first shell S11 may include the second quantum dot material described above. In some embodiments, the materials of the first and second shells S21 and S22 of the second quantum dot 560 may be different from each other, and may include the second quantum dot material. In an example embodiment, the material of the first shell S21 may be different from the material of the second core C22. In some embodiments, the material of the second shell S22 and the material of the second core C22 may be the same as or different from each other. In an example embodiment, the materials of the second core C22, the first shell S21, and the second shell S22 may be different from each other.

When a terahertz wave is incident on the terahertz wave-visible light conversion device, the wavelength of visible light emitted from the light-emitting layer 130 may vary depending on a size and/or constituent material of the quantum dots. As an example, the smaller the size of the quantum dot, the shorter wavelength of the visible light (e.g., blue light) may be emitted from the light-emitting layer 130, and the larger the size of the quantum dot, the longer wavelength of the visible light (e.g., red light) may be emitted from the light-emitting layer 130.

In some embodiments, the light-emitting layer 130 may be a light-emitting material layer for an organic light-emitting diode (OLED) or include a light-emitting material for an OLED (hereinafter, referred to as an 'OLED material'). In an example embodiment, the OLED material may include an organic light-emitting material, for example, TFB, TAZ, TCTA, TPD and/or PVK, etc., but is not limited thereto.

When the terahertz wave is incident on the visible light conversion device, depending on the OLED material used as the light-emitting layer 130, the type of visible light emitted from the light-emitting layer 130 may vary. For example, when the OLED material is a red light-emitting material, red light may be emitted from the light-emitting layer 130 when a terahertz wave is incident on the terahertz wave-visible light conversion device, and the OLED material may be a green light-emitting material or a blue light-emitting material, green light or blue light may be emitted from the light-emitting layer 130.

In some embodiments, when the light-emitting layer 130 includes quantum dots, the light-emitting layer 130 may include only quantum dots of substantially the same size, or quantum dots of different sizes. When the light-emitting layer 130 includes an OLED material, the light-emitting layer 130 may include only a single color (e.g., red, green, or blue) light-emitting material, but may include a layer in which a plurality of light-emitting materials emitting different visible light are mixed. Accordingly, when a terahertz wave is incident on the terahertz wave-visible light conversion device, according to a selection or combination of materials used as the light-emitting layer 130, visible light of a single color or a substantially single color may be emitted from the light-emitting layer 130, or several types of visible light having different wavelengths from each other may be simultaneously emitted.

As shown in FIGS. 2 to 4, an inner wall of the through hole H1 and an outer wall of the second metal pattern 120B parallel or substantially parallel to the inner wall and facing the inner wall (i.e., side surfaces of the gap 2*g*1) may be perpendicular or substantially perpendicular to the one surface 2S1 of the substrate 110.

In some embodiments, the inner wall of the through hole H1 and/or the outer wall of the second metal pattern 120B may not be perpendicular to or substantially perpendicular to the one surface 2S1 of the substrate 110. Accordingly, one side or both sides in the gap 2*g*1 may not be perpendicular to or substantially not perpendicular to the one surface 2S1 of the substrate 110.

Figure 6A:
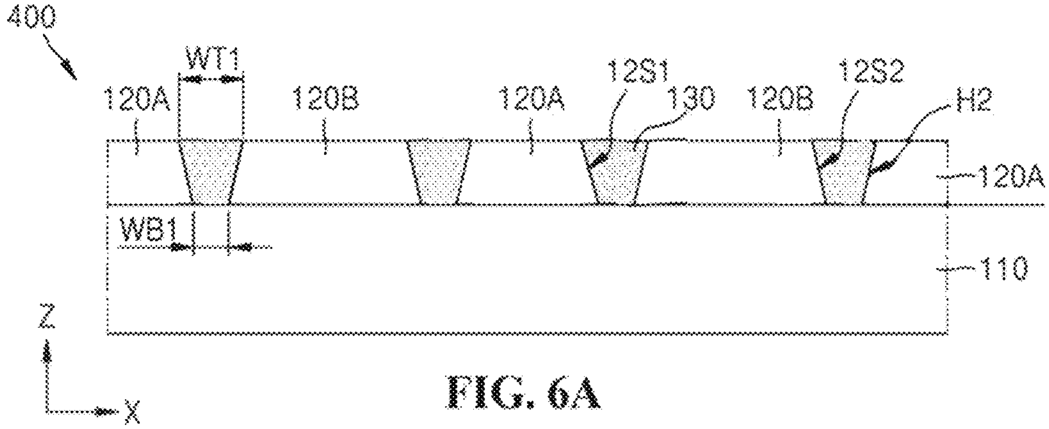
FIGS. 6A and 6B respectively are a cross-sectional view and a plan view of a fourth terahertz wave-visible light conversion device according to an embodiment.
Figure 6B:
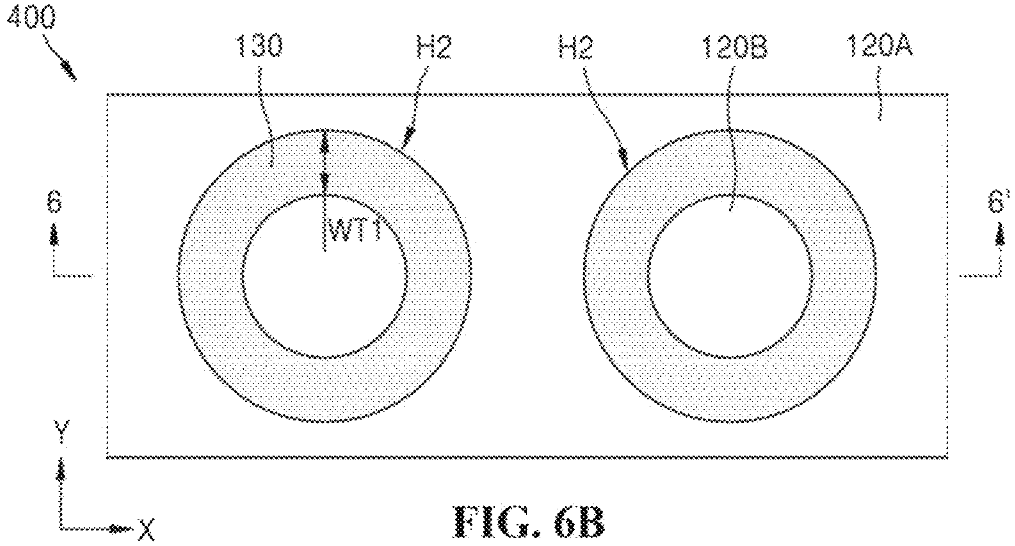

For example, FIGS. 6A and 6B show a fourth terahertz wave-visible light conversion device 400. FIG. 6A is a cross-sectional view taken along line 6-6' of FIG. 6B, and FIG. 6B is a plan view of the fourth terahertz wave-visible light conversion device 400.

Referring to FIGS. 6A and 6B, a second through hole H2 is formed in the first metal pattern 120A, and a second metal pattern 120B is present on a partial region of the substrate 110 exposed through the second through hole H2. An inner wall 12S1 of the second through hole H2 and an outer wall 12S2 of the second metal pattern 120B may be inclined surfaces that are neither perpendicular to, nor substantially perpendicular to, a surface of the substrate 110 on which the first and second metal patterns 120A and 120B of the substrate 110 are formed. An angle of inclination of the inclined surfaces may fall within a range of acute angles that are not substantially perpendicular, for example less than 90° and greater than or equal to 45°, but a lower limit may be less than 45°.

In the fourth terahertz wave-visible light conversion device 400, the inner wall 12S1 of the second through hole H2 and the outer wall 12S2 of the second metal pattern 120B are inclined surfaces, but dimensions, alignment relationships, and alignment types of the first and second metal patterns 120A and 120B may follow the first terahertz-visible light conversion device 100. Accordingly, the light-emitting layer 130 filling a gap around the second metal pattern 120B (i.e., the light-emitting layer 130 filling the second through hole H2 between the first metal pattern 120A and the second metal pattern 120B) may be a ring-shaped nano structure or a nano-coax structure.

When a side surface in the gap 2*g*1 is an inclined surface, a width of the gap 2*g*1 may change in a direction perpendicular to the substrate 110 (i.e., according to a depth of the gap 2*g*1). In this case, a width WT1 of an upper end of the gap 2*g*1 may be greater than a width WB1 of a lower end. Accordingly, a size of an entrance of the gap 2*g*1 may be greater than a size of a bottom of the gap 2*g*1. When the side surface in the gap 2*g*1 is an inclined surface, the width WT1 of the upper end and the width WB1 of the lower end of the gap 2*g*1 may fall within a range of the width W1 of the gap 2*g*1 described with reference to FIG. 1.

In some embodiments, the second through hole H2 may be completely filled with the light-emitting layer 130.

Figure 7:
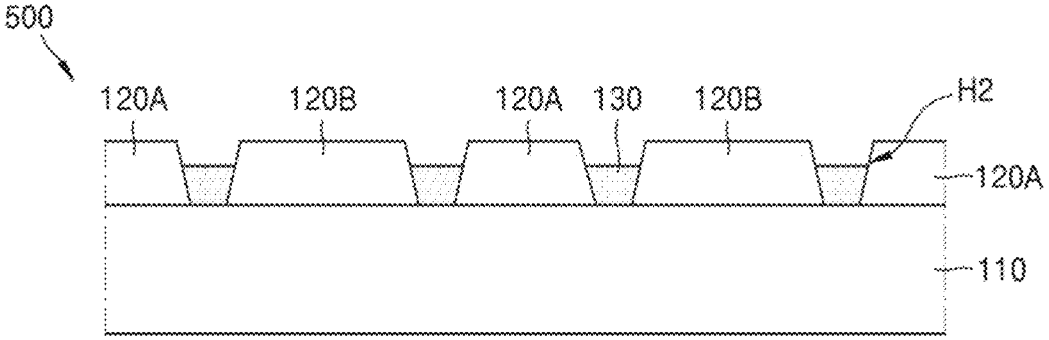
FIG. 7 is a cross-sectional view illustrating a case in which a gap in FIG. 6A is not completely filled with a light-emitting layer (a fifth terahertz wave-visible light conversion device)

However, like a fifth terahertz wave-visible light conversion device 500 shown in FIG. 7, only a portion of the second through hole H2 between the first metal pattern 120A and the second metal pattern 120B may be filled with the light-emitting layer 130. When only a portion of the second through hole H2 is filled with the light-emitting layer 130, the degree of filling the second through hole H2 with the light-emitting layer 130 may follow the case when the light-emitting layer 130 fills a portion of the first through hole H1.

Figure 8:
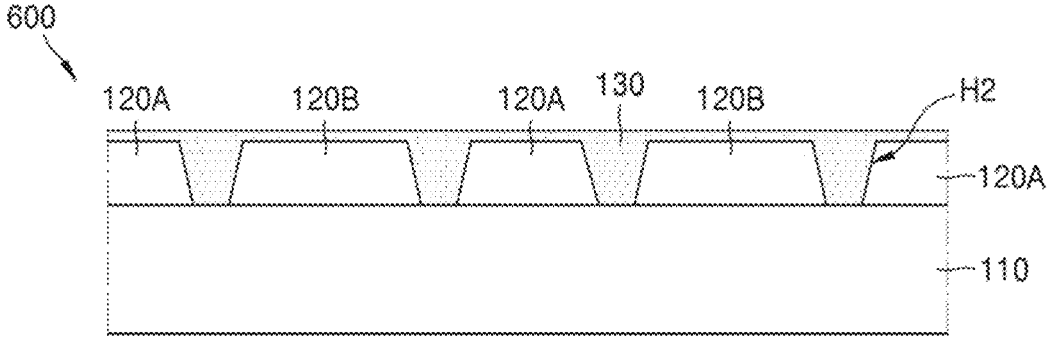
FIG. 8 is a cross-sectional view illustrating a case in which the gap is completely filled with the light-emitting layer in FIG. 6A and the light-emitting layer extends onto a metal pattern adjacent to the gap (the sixth terahertz wave-visible light conversion device)

In some embodiments, like a sixth terahertz wave-visible light conversion device 600 shown in FIG. 8, the entire second through hole H2 may be filled with the light-emitting layer 130, and the light-emitting layer 130 may extend onto the first and second metal patterns 120A and 120B. In this case, the light-emitting layer 130 may be formed to cover the entire upper surface of the first and second metal patterns 120A and 120B. A thickness of the light-emitting layer 130 on the upper surfaces of the first and second metal patterns 120A and 120B may be uniform as a whole or substantially uniform. In some embodiments, the thickness of the light-emitting layer 130 on the upper surfaces of the first and second metal patterns 120A and 120B may be less than a depth of the second through hole H2 or the thickness of the first and second metal patterns 120A and 120B, but may not be limited to the case.

Figure 9:
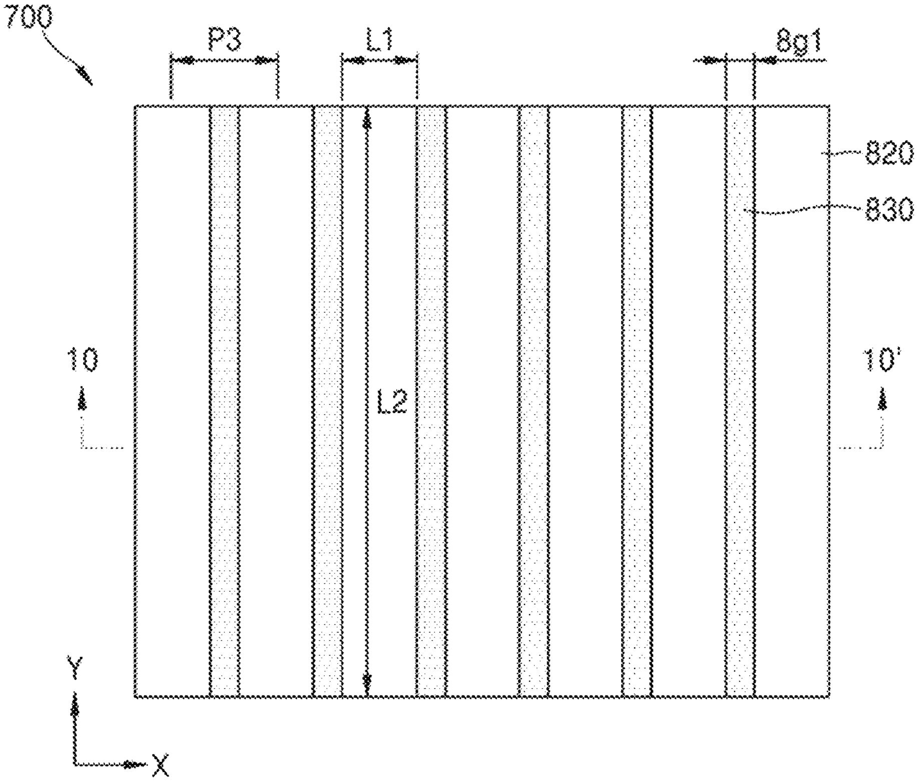
FIG. 9 is a plan view illustrating a seventh terahertz wave-visible light conversion device according to an embodiment.
Figure 10:
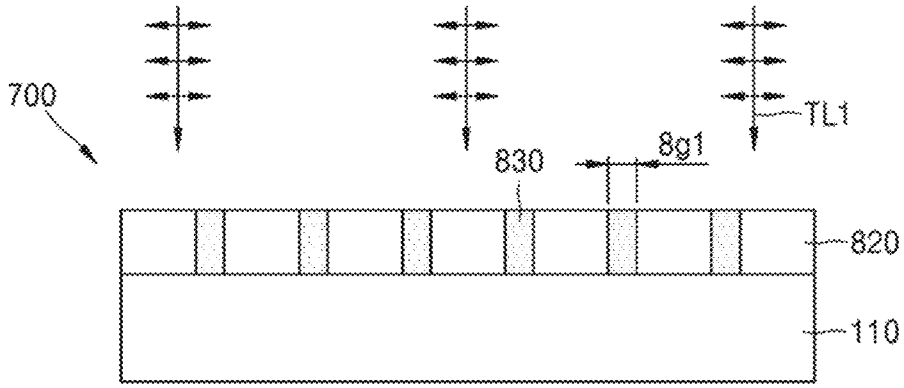
FIG. 10 is a cross-sectional view taken along line 10-10' of FIG. 9.

FIG. 9 shows a seventh terahertz wave-visible light conversion device 700, and FIG. 10 shows a cross-sectional view taken along line 10-10' of FIG. 9.

Referring to FIGS. 9 and 10 together, the seventh terahertz wave-visible light conversion device 700 may include a plurality of metal patterns 820 disposed parallel to each other on a substrate 110. The plurality of metal patterns 820 are separated from each other at constant intervals or at substantially constant intervals in a given direction (e.g., an X-axis direction). Each metal pattern 820 may have a first length L1 in a first direction (e.g., the X-axis direction), and a second length L2 in a second direction (e.g., a Y-axis direction) perpendicular to the first direction. The first length L1 may be less than the second length L2. In this case, the first length L1 may be expressed as a width of the metal pattern 820, and the second length L2 may be expressed as a length of the metal pattern 820.

The plurality of metal patterns 820 may be arranged in a stripe shape parallel to the Y-axis, and may be aligned to have a third pitch P3 in the X-axis direction. In some embodiments, a size of the third pitch P3 may be the same as or substantially the same as the first pitch P1 of FIG. 1.

There may be a plurality of gaps 8*g*1 between the plurality of metal patterns 820. As a result, the plurality of gaps 8*g*1 may exist on the substrate 110 together with the plurality of metal patterns 820. The plurality of gaps 8*g*1 may also be arranged parallel to each other in a stripe shape. Each of the gap 8*g*1 may correspond to a gap between two adjacent metal patterns 820. A size of the gap 8g1 is less than the first length L1 of the metal pattern 820. In an example embodiment, the gap 8g1 may be less than ½ of the first length L1 of the metal pattern 820, but is not limited thereto. A portion of the substrate 110 may be exposed through the gap 8g1. The gap 8g1 may be filled with a light-emitting layer 830, and a portion of the substrate 110 exposed through the gap 8g1 may be completely covered by the light-emitting layer 830. In some embodiments, one gap 8g1 may be completely filled with the light-emitting layer 830 as shown in FIG. 10, but, as shown in FIG. 3, in which one through hole H1 is only partially filled with the light-emitting layer 130, the one gap 8g1 may also be partially filled with the light-emitting layer 830. In some embodiments, the light-emitting layer 830 that completely fills the gap 8g1 may extend onto the plurality of metal patterns 820 as in the case of the third terahertz wave-visible light conversion device 300 illustrated in FIG. 4. In this case, the light-emitting layer 830 may be formed to cover the entire upper surface of the plurality of metal patterns 820 between the gaps 8g1. A thickness of the light-emitting layer 830 on the plurality of metal patterns 820 may be constant or substantially constant as a whole.

In some embodiments, a size of the gap 8g1 may be the same as or substantially the same as the size of the gap 2g1 described with reference to FIG. 1. The gap 8g1 may be between the plurality of metal patterns 820 arranged in a stripe shape and has a nanometer size, and thus the gap 8g1 may correspond to a nano-slit.

In some embodiments, a material (substance) of the metal layer 820 may be the same as that of the metal layer 120 of FIG. 1, but may not be limited to the case.

In an some embodiments, a material (substance) of the light-emitting layer 830 may be the same as the material of the light-emitting layer 130 described above, but may not be limited to the case.

In FIG. 10, side surfaces of the metal pattern 820 between the gaps 8g1 may be perpendicular or substantially perpendicular to a surface (e.g., an upper surface) of the substrate 110 on which the metal pattern 820 is formed. Accordingly, both side surfaces of the metal pattern 820 may be parallel or substantially parallel to each other, but may not be limited to the case. For example, both side surfaces of the metal pattern 820 may be inclined surfaces like the side surfaces of the second metal pattern 120B described with reference to FIGS. 6A and 6B. In this case, the shape and mutual arrangement relationship of the metal pattern 820, the gap 8g1, and the light-emitting layer 830 may be the same as or substantially the same as the shape and arrangement relationship of the first and second metal patterns 120A and 120B, the gap 2g1, and the light-emitting layer 130 described with reference to FIGS. 6 to 8.

The seventh terahertz wave-visible light conversion device 700 illustrated in FIGS. 9 and 10 may be a device for detecting terahertz waves polarized in a horizontal direction, that is, polarized parallel to the x-axis. That is, when a terahertz wave TL1 polarized in the horizontal direction is incident on the seventh terahertz wave-visible light conversion device 700 illustrated in FIGS. 9 and 10, the terahertz wave TL1 is vertically incident on the gap 8g1 aligned in the vertical direction (y-axis direction). Accordingly, a strong field enhancement phenomenon occurs in a portion of the gap 8g1 where the terahertz wave TL1 is incident. Due to the electric field enhancement phenomenon, visible light may be emitted from the light-emitting layer 830 that fills the gap 8g1 of a portion where the terahertz wave TL1 is incident. By detecting or measuring the emission of visible light, it may be seen that the terahertz wave is incident, and information about a polarization state of the terahertz wave may also be obtained.

When a terahertz wave polarized in a direction perpendicular to the gap 8g1 is incident on the gap 8g1, a strong field enhancement may occur in the gap 8g1, and thus, even when a terahertz wave with very small photon energy is incident, visible light may be emitted from the light-emitting layer 830. This may denote that the terahertz wave-visible light conversion device has high sensitivity for detecting terahertz waves. In addition, because terahertz wave incident and resulting visible light emission may occur immediately, a rapid terahertz wave detection is possible, and because such detection may be performed at room temperature, use of the device may be free from environmental constraints related to temperature and pressure.

In the seventh terahertz wave-visible light conversion device 700, the metal pattern 820 and the gap 8g1 are aligned parallel to the y-axis, but may be aligned in a direction different from the y-axis. For example, as shown in FIG. 11, the metal pattern 820 and the gap 8g1 may be aligned in a horizontal direction (e.g., x-axis direction).

Figure 11:
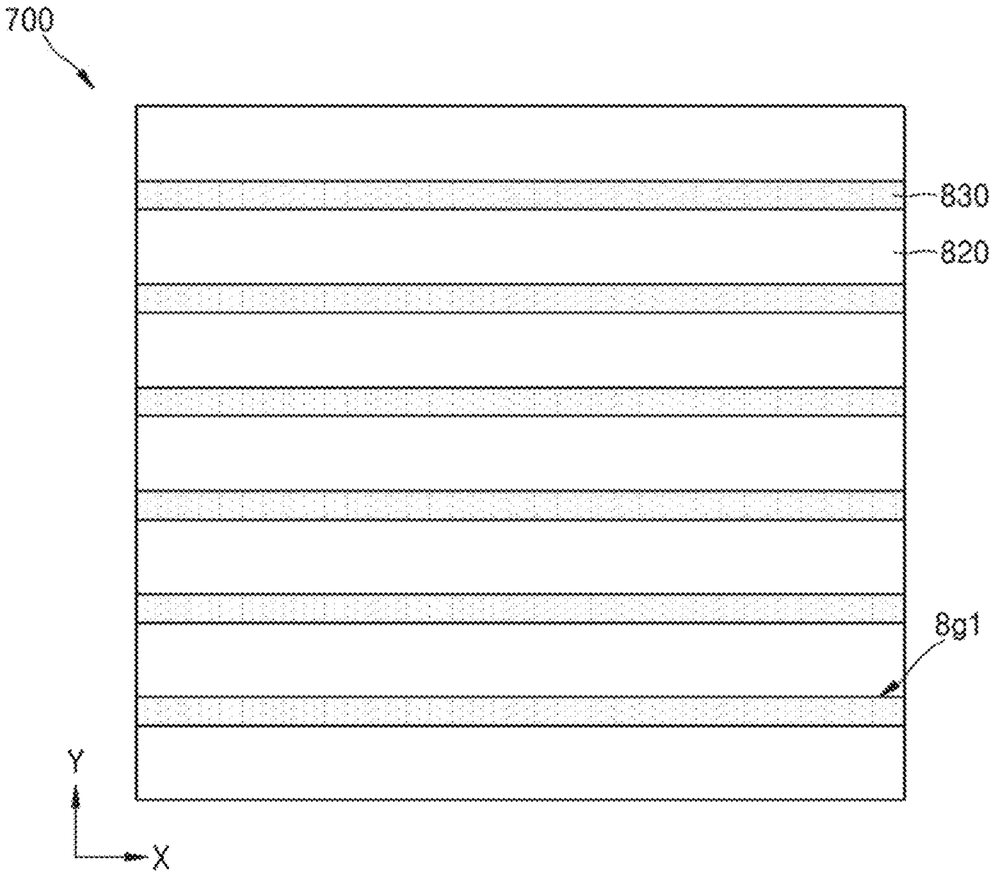
FIG. 11 is a plan view illustrating a case in which a metal pattern and a gap are arranged in a horizontal direction in FIG. 9.

When the metal pattern 820 and the gap 8g1 of the seventh terahertz wave-visible light conversion device 700 are aligned as shown in FIG. 11, the seventh terahertz wave-visible light conversion element 700 may be a device for detecting terahertz waves polarized in the vertical direction, that is, polarized in parallel to the y-axis.

Figure 12:
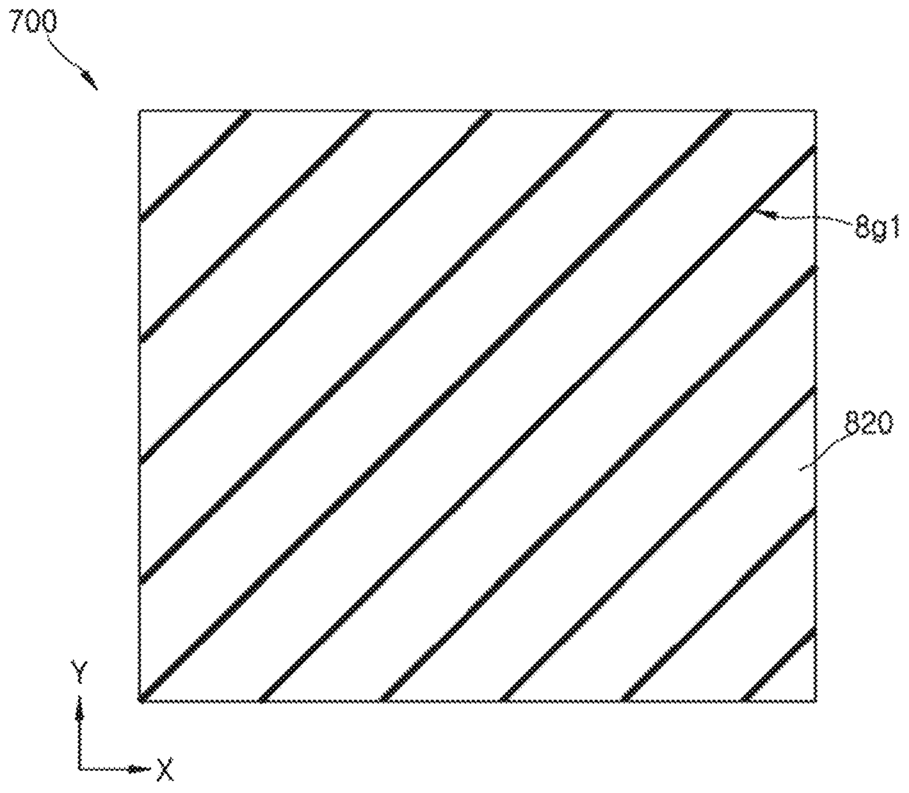
FIG. 12 is a plan view illustrating a case in which the metal pattern and the gap in FIG. 9 are inclined at an acute angle with respect to the x-axis.
Figure 13:
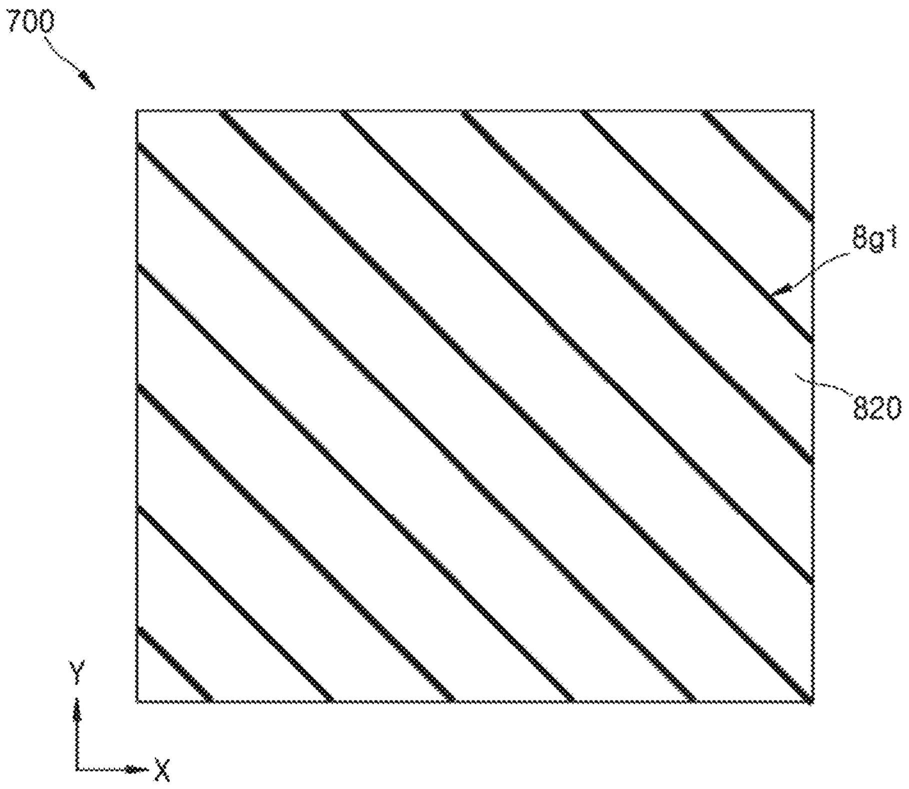
FIG. 13 is a plan view illustrating a case in which the metal pattern and the gap in FIG. 9 are inclined at an obtuse angle with respect to the x-axis.

In some embodiments, the metal pattern 820 and the gap 8g1 of the seventh terahertz wave-visible light conversion device 700, as shown in FIGS. 12 and 13, may also be aligned in a direction inclined with respect to the x-axis or the y-axis. As an example, the metal pattern 820 and the gap 8g1 may be aligned at an acute angle (e.g., +45°) with respect to the x-axis (see FIG. 12) or at an obtuse angle (e.g., +135°) with respect to the x-axis (see FIG. 13).

When the metal pattern 820 and the gap 8g1 of the seventh terahertz wave-visible light conversion device 700 are aligned at an acute angle with respect to the x-axis as shown in FIG. 12 (e.g., when the acute angle is +45°) the seventh terahertz wave-visible light conversion device 700 may detect a terahertz wave that is linearly polarized in a direction forming +135° with the x-axis.

When the metal pattern 820 and the gap 8g1 of the seventh terahertz wave-visible light conversion device 700 are aligned at an obtuse angle with respect to the x-axis as shown in FIG. 13 (e.g., when the obtuse angle is +135°) the seventh terahertz wave-visible light conversion device 700 may detect a terahertz wave that is linearly polarized in a direction forming +45° with the x-axis.

As described above, the seventh terahertz wave-visible light conversion device 700 may detect terahertz waves linearly polarized in various directions according to alignment directions of the metal pattern 820 and the gap 8g1.

For convenience of illustration, in FIGS. 12 and 13, the gap 8g1 is indicated by a thick line, and illustration of the light-emitting layer is omitted.

FIGS. 14A to 14D show a first experiment and simulation results for a terahertz wave-visible light conversion of a terahertz wave-visible light conversion device having a nano-slit.

In the first experiment and simulation to obtain the result of FIGS. 14A to 14D, the seventh terahertz wave-visible light conversion device 700 shown in FIGS. 9 and 10 may be used.

The first experiment and simulation were divided into cases when the size of the gap 8g1 (nano-slit) was 50 nm, 100 nm, 150 nm, 500 nm, and 2 μm, and the same material (e.g., quantum dots) of the light-emitting layer 830 was used.

Figure 14A:
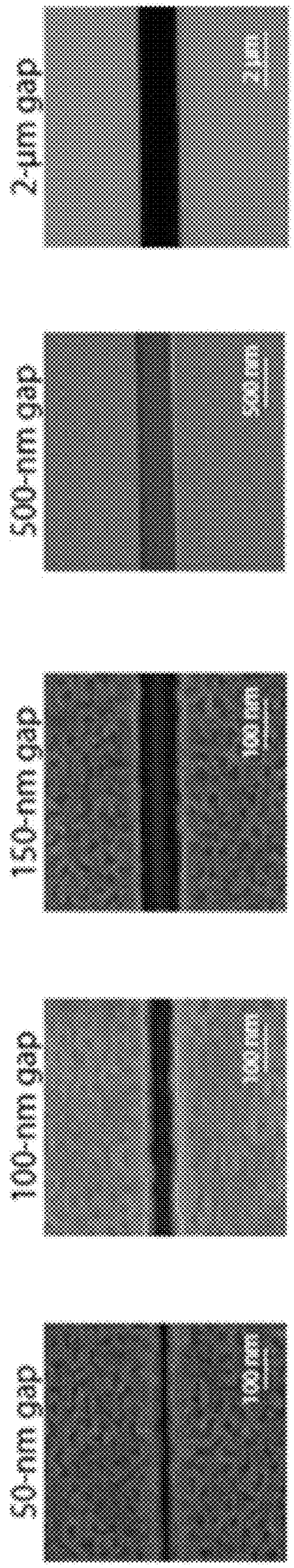
FIGS. 14A and 14B are scanning electron microscope (SEM) images showing first experiment and simulation results for a terahertz wave-visible light conversion of a terahertz wave-visible light conversion device having a nano-slit and FIGS. 14C and 14D are graphs showing the first experiment and simulation results for the terahertz wave-visible light conversion of the terahertz wave-visible light conversion device having a nano-slit.

FIG. 14A is a scanning electron microscope (SEM) image showing the metal pattern 820 and the gap 8$g$1 between the metal patterns 820 together.

Figure 14B:
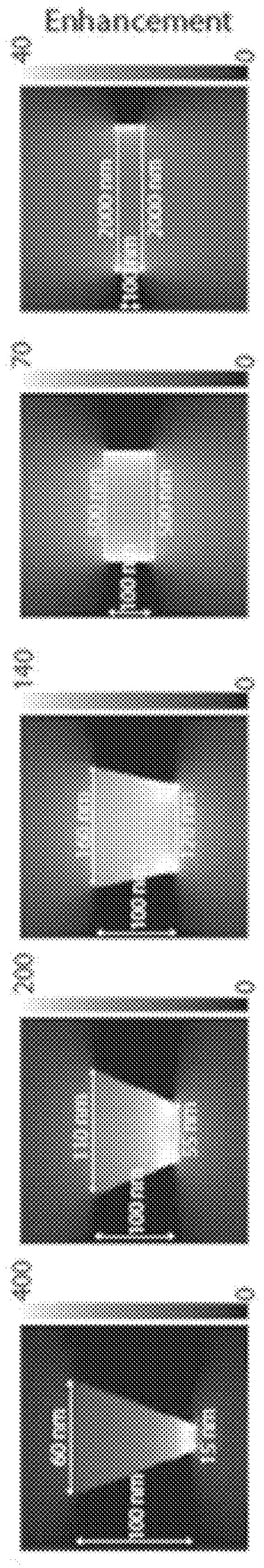

FIG. 14B is a photograph showing electroluminescence generated when a terahertz wave is incident on the metal pattern having the gap of FIG. 14A.

Figure 14C:
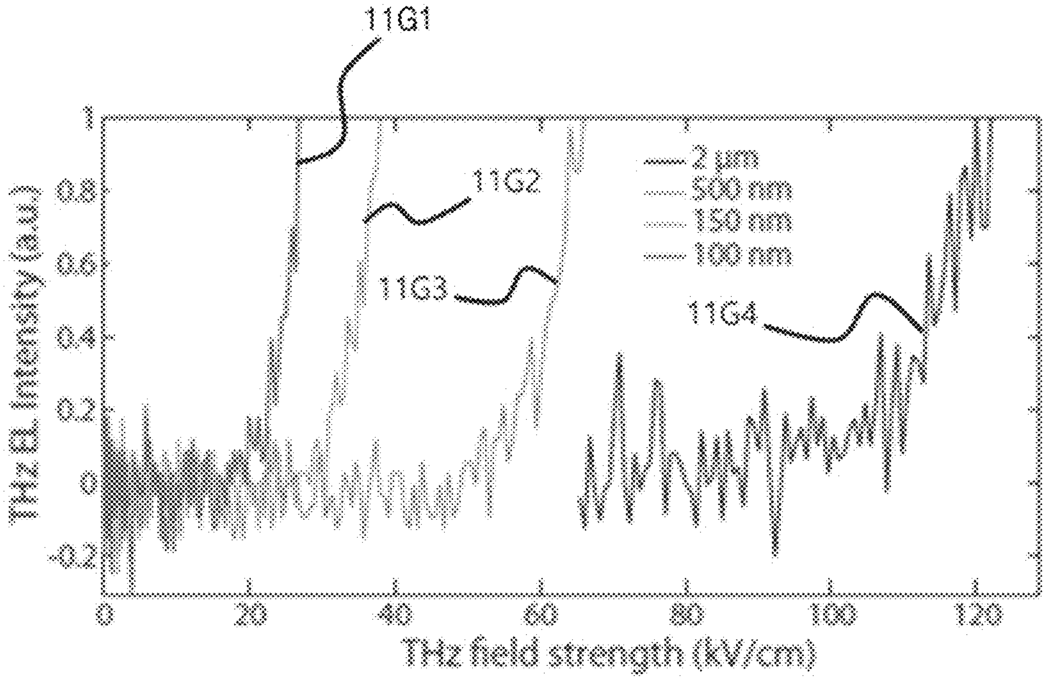

FIG. 14C shows a relationship between the intensity of the terahertz wave incident on the seventh terahertz wave-visible light conversion device 700 and the intensity of electroluminescence according to the intensity of the terahertz wave (the relationship between terahertz wave intensity and electroluminescence intensity) when the gap 8$g$1 is 100 nm, 150 nm, 500 nm, and 2 μm. The horizontal axis represents the intensity of the terahertz wave, and the vertical axis represents the intensity of the electroluminescence due to the incident terahertz wave.

In FIG. 14C, a first graph 11G1 shows the intensity of electroluminescence due to an incident terahertz wave when the gap 8$g$1 is 100 nm, a second graph 11G2 shows the intensity of electroluminescence due to an incident terahertz wave when the gap 8$g$1 is 150 nm, a third graph 11G3 shows the intensity of electroluminescence due to an incident terahertz wave when the gap 8$g$1 is 500 nm, and a fourth graph 11G4 shows the intensity of electroluminescence due to an incident terahertz wave when the gap 8$g$1 is 2 μm.

Comparing the first to fourth graphs 11G1 to 11G4, as the size of the gap 8$g$1 decreases, a threshold intensity of the terahertz wave for exhibiting the electroluminescence of a given intensity lowers.

Figure 14D:
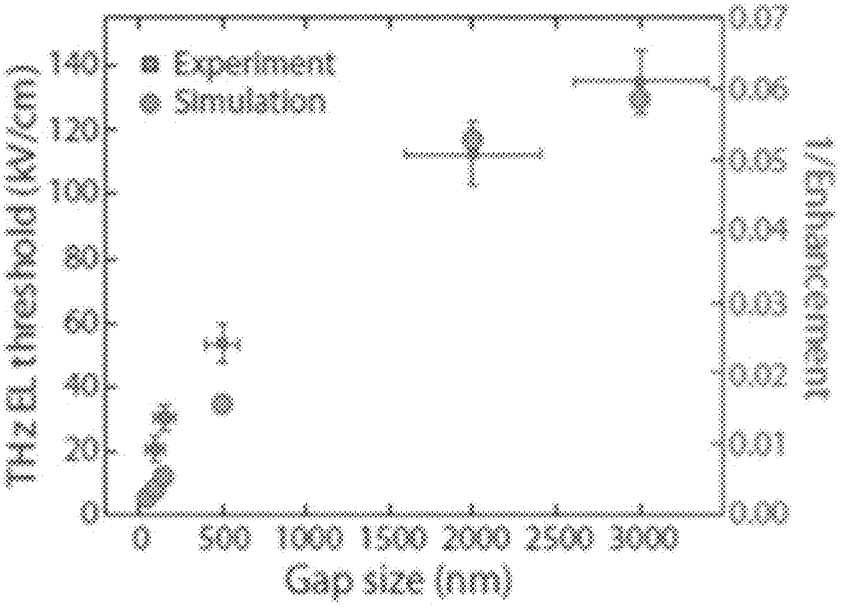

FIG. 14D is a graph showing the results of the first experiment and simulation together. In FIG. 14D, the horizontal axis represents the size of the gap 8$g$1, the left vertical axis represents a threshold intensity of terahertz waves for electroluminescence, and the right vertical axis represents 1/enhancement. In FIG. 14D, a circle (○) indicates a first simulation result, and a square (□) indicates a first experiment result.

Referring to FIG. 14D, it may be seen that the first experimental result and the first simulation result are generally in correspondence with each other.

Figure 15A:
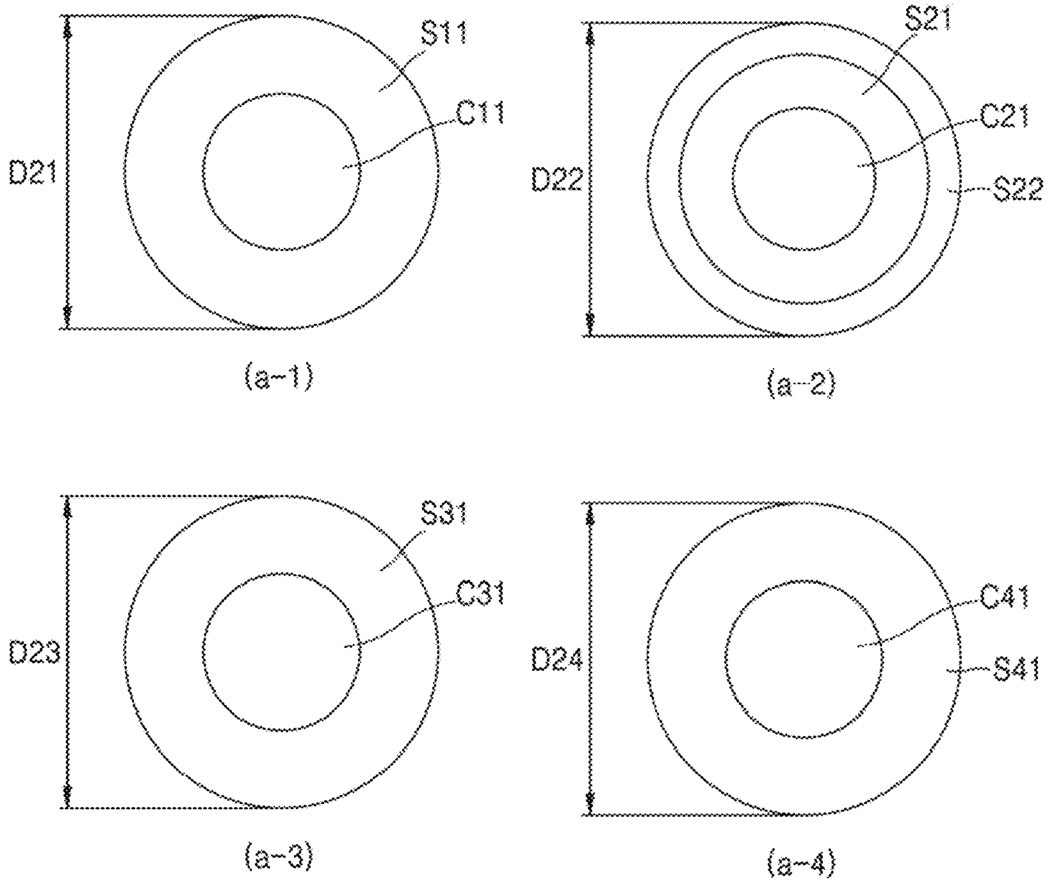
FIG. 15A is a cross-sectional view showing quantum dots used in a second experiment for a terahertz wave-visible light conversion of a terahertz wave-visible light conversion device having a nano-slit.
Figure 15B:
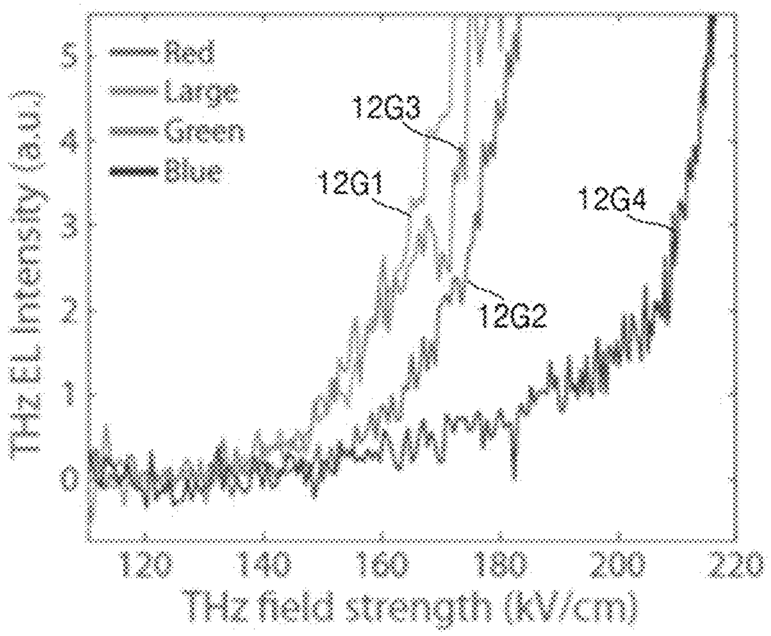
FIGS. 15B and 15C are graphs showing results of the second experiment.
Figure 15C:
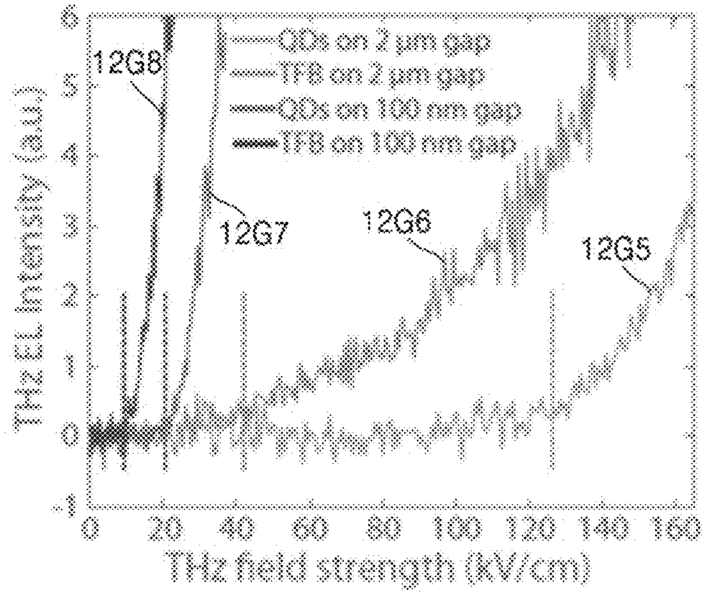

FIG. 15A shows examples of quantum dots used in a second experiment for a terahertz wave-visible light conversion of a terahertz wave-visible light conversion device having a nano-slit. FIGS. 15B and 15C show results of the second experiment.

In the second experiment, the seventh terahertz wave-visible light conversion device 700 having nano-slits shown in FIGS. 9 and 10 is used.

In the second experiment, a gap 8$g$1 of the seventh terahertz wave-visible light conversion device 700 was divided into a case of 100 nm and a case of 2 μm.

In addition, in the second experiment, first to fifth light-emitting layers different from each other were used as the light-emitting layer 830. The first light-emitting layer includes a first quantum dot, the second light-emitting layer includes a second quantum dot, the third light-emitting layer includes a third quantum dot, the fourth light-emitting layer includes a fourth quantum dot, and the fifth light-emitting layer includes TFB, which is an OLED material. The first to fourth quantum dots have different sizes and configurations from each other.

FIG. 15A shows examples of the first to fourth quantum dots. In FIG. 15A, (a-1) denotes the first quantum dot, (a-2) denotes the second quantum dot, (a-3) denotes the third quantum dot, and (a-4) denotes the fourth quantum dot.

As shown in FIG. 15A, all of the first to fourth quantum dots a-1, a-2, a-3, and a-4 have a core-shell structure. The first, third, and fourth quantum dots a-1, a-3, and a-4 include cores C11, C31, and C41 and shells S11, S31, and S41, respectively, and the second quantum dot a-2 includes a core C21 and two shells S21 and S22.

The first and second quantum dots a-1 and a-2 emit visible light belonging to a red light (R) band in response to an electric field enhancement caused by an incident terahertz wave. Although the first and second quantum dots a-1 and a-2 both emit visible light belonging to the red light band, sizes (e.g., diameters) D21 and D22 of the first and second quantum dots a-1 and a-2 are different from each other. Accordingly, the size D21 of the first quantum dot a-1 is greater than that of the second quantum dot a-2 (i.e., D21>D22). Therefore, a wavelength of visible light emitted from the first quantum dot a-1 is longer than a wavelength of visible light emitted from the second quantum dot a-2. A core material of the first quantum dot a-1 may include CdSe, and a shell material may include CdS, and thus, the first quantum dot a-1 may emit red visible light having a wavelength of 625 nm. A core material of the second quantum dot a-2 includes CdSe, a material of the first shell S21 includes CdS, and a material of the second shell S22 includes ZnS, and thus, the second quantum dot a-2 may emit red visible light with a wavelength of 605 nm.

The third quantum dot a-3 emits green visible light in response to an electric field enhancement caused by an incident terahertz wave. The size D23 of the third quantum dot a-3 is less than the size D22 of the second quantum dot a-2 (D22>D23). A core material of the third quantum dots a-3 includes CdSeS, and a material of the shell includes ZnS. The third quantum dot a-3 may emit green visible light having a wavelength of 530 nm. The size D24 of the fourth quantum dot a-4 is less than that of the third quantum dot a-3 (D23>D24). The fourth quantum dot a-4 emits blue visible light in response to an electric field enhancement caused by an incident terahertz wave. A core material of the fourth quantum dot a-4 includes CdS, a material of the shell S41 includes ZnS, and thus, the fourth quantum dot a-4 may emit blue visible light having a wavelength of 480 nm.

FIG. 15B shows, as results of the second experiment, a relationship between the intensity of electroluminescence and the intensity of the terahertz wave incident on the seventh terahertz wave-visible light conversion device 700 when the gap 8$g$1 is 2 μm and the light-emitting layer 830 is the first to fourth light-emitting layers.

In FIG. 15B, the horizontal axis represents the intensity of an incident terahertz wave, and the vertical axis represents the intensity of electroluminescence.

In FIG. 15B, a first graph 12G1 shows a relationship between the intensity of electroluminescence and the intensity of a terahertz wave when the light-emitting layer 830 is a quantum dot layer including the first quantum dots a-1. A second graph 12G2 shows a relationship between the intensity of electroluminescence and the intensity of a terahertz wave when the light-emitting layer 830 is a quantum dot layer including the second quantum dots a-2. A third graph 12G3 shows a relationship between the intensity of electroluminescence and the intensity of the terahertz wave when the light-emitting layer 830 is a quantum dot layer including the third quantum dots a-3. A fourth graph 12G4 shows a relationship between the intensity of electroluminescence and the intensity of the terahertz wave when the light-emitting layer 830 is a quantum dot layer including the fourth quantum dots a-4.

In FIG. 15B, comparing the first to fourth graphs 12G1 to 12G4, the terahertz wave threshold intensity (i.e., at which the electroluminescence occurs) in the fourth graph 12G4 is slightly higher than that of the first to third graphs 12G1 to 12G3, but the difference is not significant.

These results indicate that, when the gap **8*g*1 is constant (i.e., when the size of the nano-slit is constant, even when quantum dot layers having different sizes and/or configurations are used as the light-emitting layer 830**) there is no significant difference in the terahertz wave threshold intensity, at which electroluminescence occurs.

FIG. 15C shows, as results of the second experiment, a relationship between the intensity of electroluminescence and the intensity of a terahertz wave incident on the seventh terahertz wave-visible light conversion device 700 when the gap **8*g*1 is 100 nm or 2 μm, and the light-emitting layer 830** is a quantum dot layer or a layer including an OLED material TFB[(C51H61N)n].

In FIG. 15C, the horizontal axis represents the intensity of an incident terahertz wave, and the vertical axis represents the intensity of electroluminescence.

A fifth graph 12G5 in FIG. 15C shows a relationship between the intensity of an incident terahertz wave and the intensity of electroluminescence when the gap **8*g*1 is 2 μm and the light-emitting layer 830 is a quantum dot layer. A sixth graph 12G6 shows a relationship between the intensity of an incident terahertz wave and the intensity of electroluminescence when the gap 8*g*1 is 2 μm and the light-emitting layer 830 is a TFB layer. A seventh graph 12G7 shows a relationship between the intensity of an incident terahertz wave and the intensity of electroluminescence when the gap 8*g*1 is 100 nm and the light-emitting layer 830 is a quantum dot layer. An eighth graph 12G8 shows a relationship between the intensity of an incident terahertz wave and the intensity of electroluminescence when the gap 8*g*1 is 100 nm and the light-emitting layer 830** is a TFB layer.

Comparing the fifth to eighth graphs 12G5 to 12G8 in FIG. 15C, a terahertz wave threshold intensity, at which the electroluminescence of the sixth graph 12G6 occurs, is less than a terahertz wave threshold intensity, at which the electroluminescence of the fifth graph 12G5 occurs. In addition, the terahertz wave threshold intensity, at which the electroluminescence of the eighth graph 12G8 occurs, is less than the terahertz wave threshold intensity, at which the electroluminescence of the seventh graph 12G7 occurs. These results suggest that, when the sizes of the nano-slits (gap) are the same, the threshold intensity of the terahertz wave, at which the electroluminescence occurs (starts, substantially observed), is less when the light-emitting layer is an OLED material layer than when the light-emitting layer is a quantum dot layer. The appearance of the electroluminescence means that the electroluminescence having an observable intensity or substantially observable intensity starts.

Figure 16A:
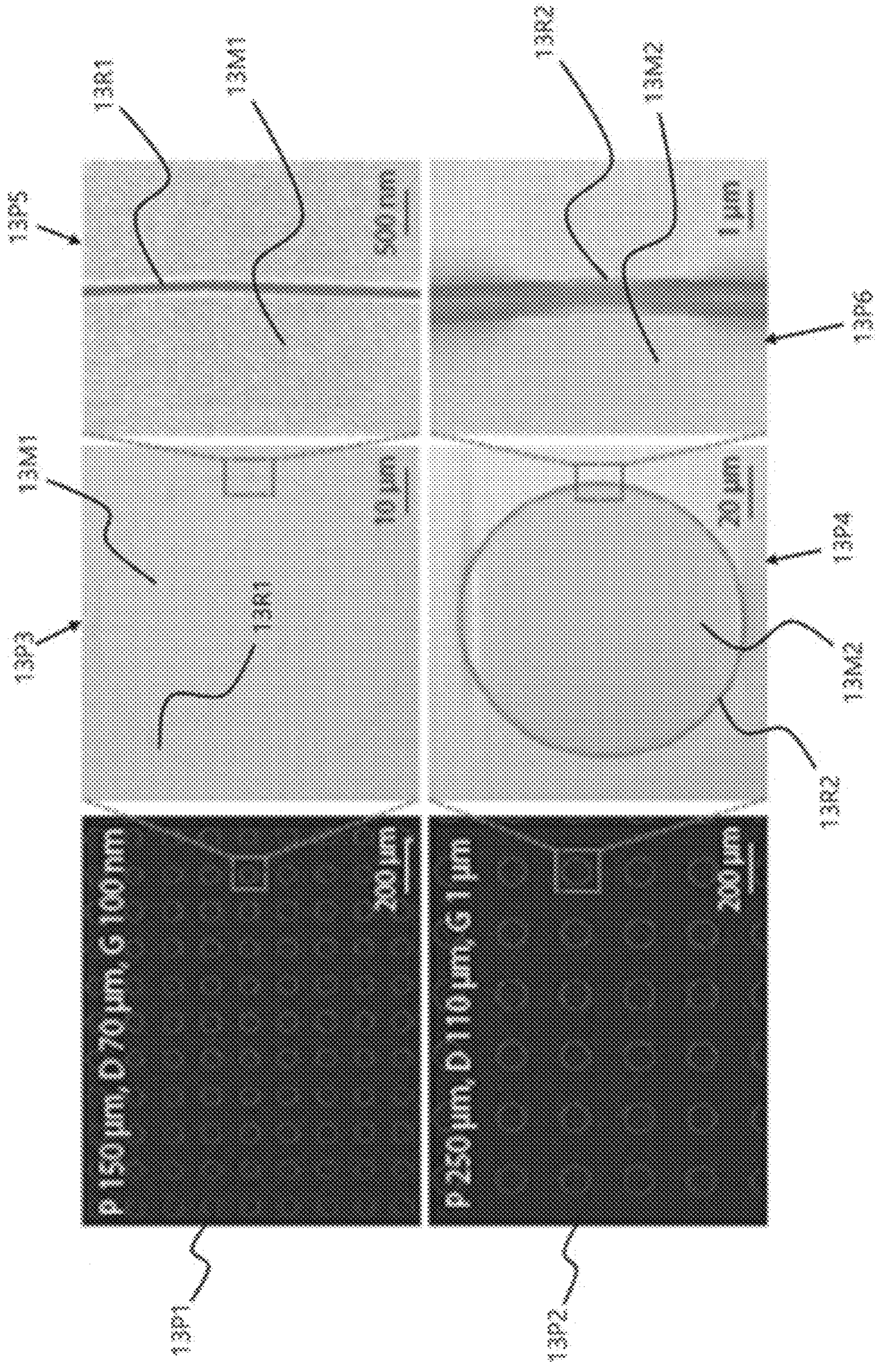
FIG. 16A is an SEM photograph of a terahertz wave-visible light conversion device having a ring-shaped or circular shaped nano-slit (gap) or a nano-coax shaped nano-slit (gap)

FIG. 16A is an SEM photograph of a terahertz wave-visible light conversion device having a ring-shaped or circular shaped nano-slit (gap) or a nano-coex-shaped nano-slit (gap). The SEM photograph of FIG. 16A is an SEM photograph of one of the terahertz wave-visible light conversion devices described with reference to FIGS. 1 to 8, and may be a photograph taken of a front surface of the metal layer 120.

In FIG. 16A, a first photo 13P1 on the upper left is for a metal layer 120 including a plurality of metal patterns arranged in a lattice form in the horizontal and vertical directions, and having a period or pitch of 150 μm, a size (i.e., diameter) of 70 μm, and a gap of 100 nm, and a second photo 13P2 on the lower left is for a metal layer 120 having a period or pitch of 250 μm, a size (i.e., diameter) of 110 μm, and a gap of 1 μm. In the first and second photos 13P1 and 13P2, the plurality of metal patterns appear very blurry because the photo is entirely dark. In the first and second photos 13P1 and 13P2, a rectangular box indicates a region including one nano-slit having a nano-coax structure and one metal pattern completely surrounded by the one nano-slit.

A third photo 13P3 at an upper center is an enlarged photo of an area limited by the rectangular box of the first photo 13P1, and a fourth photo 13P4 at a lower center is a square box of the second photo 13P2, and is an enlarged picture of a limited area.

In the third photo 13P3, reference numeral 13M1 denotes one metal pattern, and 13R1 denotes a ring-shaped nano-slit surrounding the one metal pattern 13M1, that is, a nano-slit having a nano-coax structure. In a fourth photograph 13P4, reference numeral 13M2 denotes one metal pattern, and 13R2 denotes a nano-slit of a nano-coax structure that completely surrounds the one metal pattern 13M2. The metal layer outside the nano-slits 13R1 and 13R2 corresponds to the first metal pattern 120A of FIG. 1.

A fifth photo 13P5 at an upper right is an enlarged photo of the limited area (see square box) of the third photo 13P3, and a sixth photo 13P6 at a lower right is an enlarged photo of the limited area (see square box) of the fourth photo 13P4.

The fifth and sixth photos 13P5 and 13P6 clearly show the nano-slit (gap) having the nano-coax structure.

A simulation was performed to confirm whether a field enhancement occurs on a nano-slit having a nano-coax structure when a terahertz wave is incident on the terahertz wave-visible light conversion device shown in FIG. 16A. In the above simulation, terahertz waves polarized in the horizontal direction (x-axis direction) were incident.

Figure 16B:
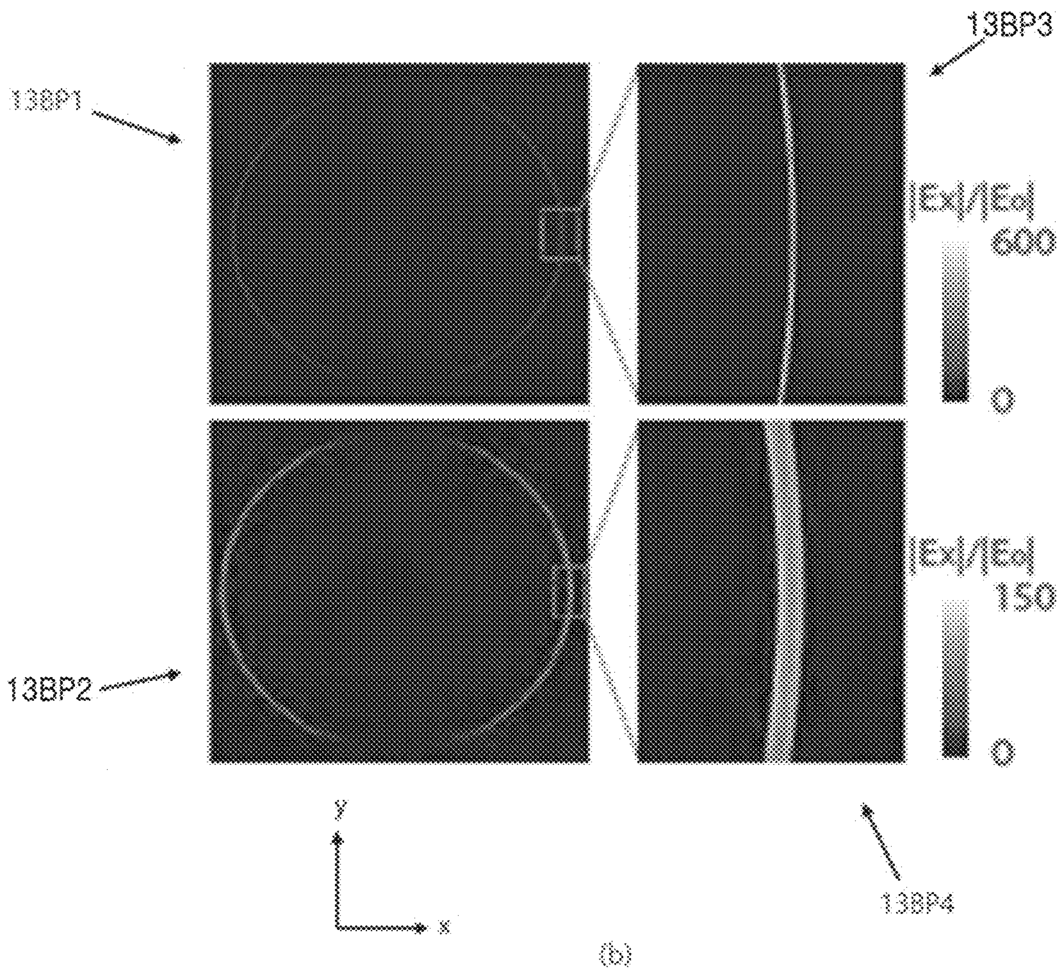
FIG. 16B is a photograph showing simulation results performed on the terahertz-visible light conversion device shown as a photograph in FIG. 16A.

FIG. 16B shows the results of the simulation. A first photo 13BP1 on the upper left of FIG. 16B shows a simulation result for the terahertz wave-visible light conversion device shown in the third photo 13P3 in FIG. 16A, and a second photo 13BP2 on the lower left is a result of the simulation for the terahertz wave-visible light conversion device shown in the fourth photograph 13P4 of FIG. 16A.

A third photo 13BP3 in an upper right of FIG. 16B is an enlarged view of a selected area (see rectangular box) of the first photo 13BP1, and a fourth photo 13BP4 in a lower right is an enlarged view of a selected area (see rectangular box) of the second photo 13BP2.

Referring to the first and second photos 13BP1 and 13BP2 of FIG. 16B, although a field enhancement phenomenon occurs in the nano-slit (gap) having a coax structure, the field enhancement does not appear in the entire nano-slit. A relatively strong field enhancement occurs in a portion perpendicular to a polarization direction of the terahertz wave (e.g., the left and right portions of the nano-slit), and the field enhancement phenomenon does not appear or substantially does not appear in a portion parallel to the polarization direction (e.g., a portion perpendicular to the y-axis of the nano-slit). The degree of the field enhancement in a nano-slit gradually decreases from a portion perpendicular to the polarization direction to a portion parallel to the polarization direction.

The field enhancement causes electroluminescence of the nano-slit. That is, when a light-emitting layer is present in the nano-slit, a material of the light-emitting layer is in an excited state due to the field enhancement. A material of the light-emitting layer in an excited state becomes in its original stable state while emitting visible light, and various colors of visible light may be emitted according to the type of the material used as the light-emitting layer.

As a result, a portion where a field enhancement occurs in the nano-slit may be generally a portion where the electroluminescence occurs (i.e., a portion where visible light is emitted).

Figure 16C:
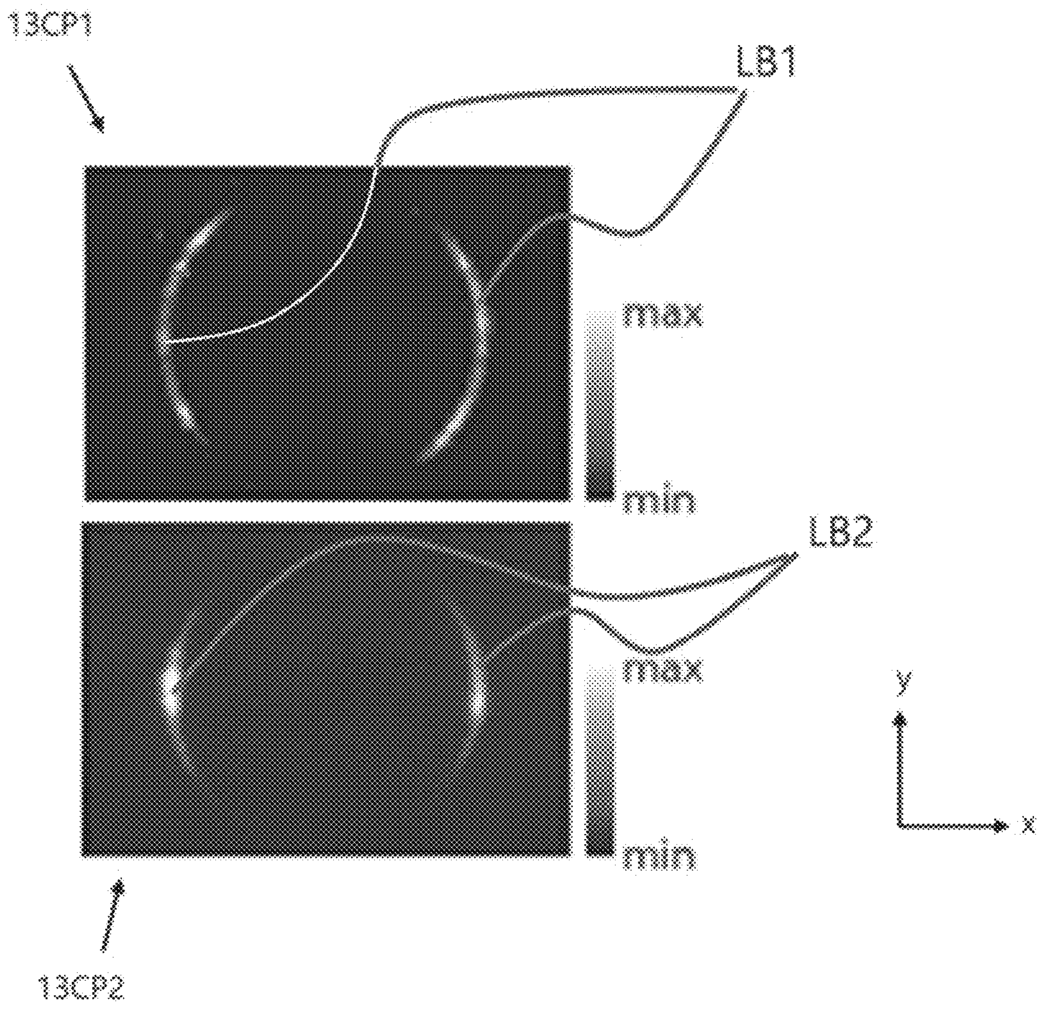
FIG. 16C is a photograph showing a result of a third experiment performed to confirm whether visible light is emitted from a light-emitting layer when a terahertz wave having a set intensity is incident on a terahertz wave-visible light conversion device in which a nano-slit (gap) having a nano-coax structure in which a field enhancement phenomenon of FIG. 16B occurs.

FIG. 16C is a photograph visually showing a result of a third experiment performed to confirm whether visible light is emitted from a light-emitting layer when a terahertz wave having a set intensity is incident on a terahertz wave-visible light conversion device in which a nano-slit (gap) having a nano-coax structure, in which the field enhancement phenomenon of FIG. 16B occurs, is filled with the light-emitting layer.

Figure 16D:
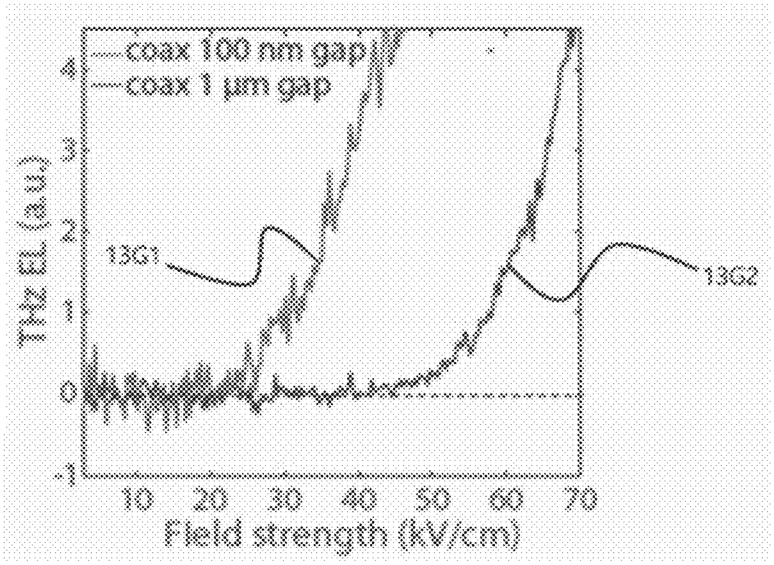
FIG. 16D is a graph showing a result of the third experiment.

FIG. 16D is a graph showing results of the third experiment.

In the third experiment, two terahertz wave-visible light conversion devices were used. One of the two terahertz wave-visible light conversion devices corresponds to the first photograph 13P1 of FIG. 16A (the nano-slit has a size of 100 nm), and the other corresponds to the second photograph 13P2 (the size of the nano-slit is 1 μm).

In the third experiment, in consideration of the size of the nano-slits of the two terahertz wave-visible light conversion devices, a horizontally polarized terahertz wave having a first intensity was incident on the terahertz wave-visible light conversion device having a nano-slit size of 100 nm, and a horizontally polarized terahertz wave having a second intensity was incident on the terahertz wave-visible light conversion device having a nano-slit size of 1 μm. The first intensity is about 40 kV/cm, and the second intensity is about 80 kV/cm.

In the third experiment, quantum dots having a core-shell structure emitting red light were used as the light-emitting layer filling the nano-slits, for example, quantum dots, in which a core material is CdSe, a material of the first shell is CdS, and a material of the second shell is ZnS, were used.

In FIG. 16C, the first photograph 13CP1 shows the results of the third experiment for the terahertz wave-visible light conversion device having a nano-slit size of about 100 nm, and the second photograph 13CP2 shows the results of the third experiment for the terahertz wave-visible light conversion device having a nano-slit size of about 1 μm.

Referring to the first and second photos 13CP1 and 13CP2, visible light-emitting regions LB1 and LB2 exist in both of the two terahertz wave-visible light conversion devices. The first light-emitting region LB1 corresponds to the position of the nano-slit having a gap of about 100 nm, and the second light-emitting region LB2 corresponds to the position of the nano-slit having a gap of about 1 μm.

In addition, because the incident terahertz wave is a wave polarized in the horizontal direction (x-axis direction), it may be seen that the light-emitting regions LB1 and LB2 are along the nano-slits with the nano-slit portion perpendicular to the polarization direction (x-axis direction) as the center, and are not in the nano-slit portion horizontal to the polarization direction (the nano-slit portion perpendicular to the y-axis direction). A relationship between the polarization state of the incident terahertz wave and the light-emitting region provides information about the polarization state of the incident terahertz wave. That is, by observing the light-emitting region of visible light emitted from the terahertz wave-visible light conversion device, it is possible to obtain information for the polarization state of a terahertz wave incident on the terahertz wave-visible light conversion device. For example, when the incident terahertz wave is polarized in the vertical direction (y-axis direction), the first and second light-emitting regions LB1 and LB2 are rotated to the left or right by 90°.

The positions of the first and second light-emitting regions LB1 and LB2 correspond to the field enhancement region described with reference to FIG. 16B.

Visible light emitted from the first and second light-emitting regions LB1 and LB2 is emitted from the light-emitting layer filling the nano-slits of the nano-coax structure. In the second experiment, the light-emitting layer includes quantum dots.

Figure 18:
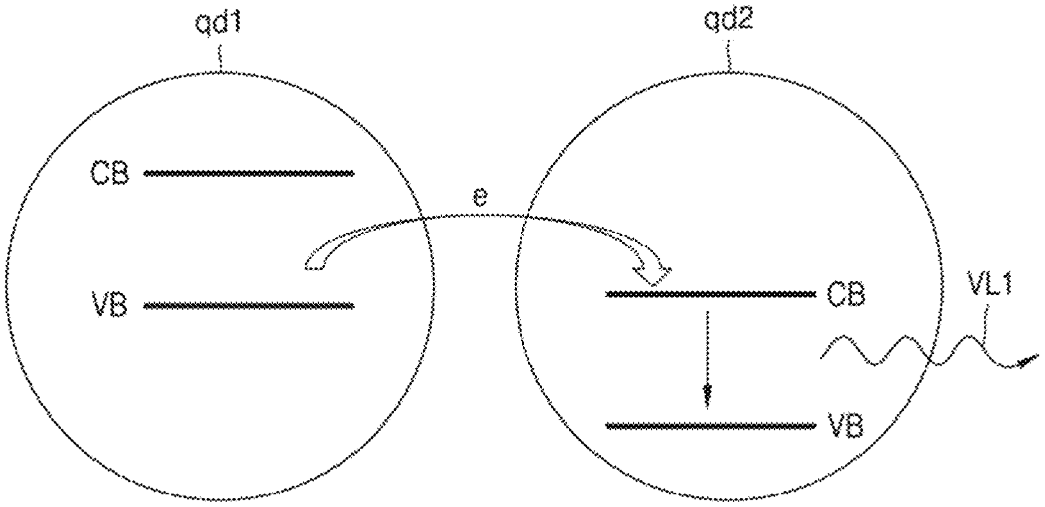
FIG. 18 is a cross-sectional view schematically showing an emission process in which a field enhancement strongly occurs on a nano-slit (gap), and thus visible light is emitted from the quantum dot layer (light-emitting layer) filled in the gap when a terahertz wave is incident on a terahertz wave-visible light conversion device.

When reviewing a process of emitting visible light from the light-emitting layer, as shown in FIG. 16B, when a terahertz wave is incident on the terahertz wave-visible light conversion device, a field enhancement phenomenon strongly occurs on the nano-slit. Visible light is emitted from the quantum dots included in the light-emitting layer by the field enhancement phenomenon, and FIG. 18 schematically shows the principle of this process. In FIG. 18, only two quantum dots qd1 and qd2 are included in the light-emitting layer for convenience.

Referring to FIG. 18, when the first quantum dot qd1 is exposed to the field enhancement appearing in the nano-slit, electrons in a valence band VB of the first quantum dot qd1 may move to the conduction band CB of the second quantum dot qd2 adjacent to the first quantum dot qd1. In FIG. 18, "e" denotes a moving electron. Electrons moved from the first quantum dot qd1 to the conduction band CB of the second quantum dot qd2 are moved to a valence band VB of the second quantum dot qd2, and visible light VL1 is emitted in this process. Visible light VL1 emitted in this way may be visible light emitted from the first and second light-emitting regions LB1 and LB2 of FIG. 16C.

In FIG. 16D, the horizontal axis represents the intensity of an incident terahertz wave, and the vertical axis represents the intensity of electroluminescence due to a terahertz wave. In addition, a first graph 13G1 shows a measurement result for a terahertz wave-visible light conversion device having a gap of about 100 nm in a nano-coax structure, and the second graph 13G2 shows a measurement result for a terahertz wave-visible light conversion device having a gap of about 1 μm in a nano-coax structure.

Comparing the first and second graphs 13G1 and 13G2, in the gap of the nano-coax structure, it may be seen that the smaller the gap size, the lower the threshold intensity of the terahertz wave for electroluminescence, and the larger the gap size, the higher the threshold intensity.

In the third experiment, an experiment (hereinafter, a fourth experiment) was also performed on the change in electroluminescence when the size of the nano-slit was the same and the shape of the nano-slit was changed.

In the fourth experiment, a terahertz wave-visible light conversion device having a nano-slit (gap) of a first shape (hereinafter, a first device) and a terahertz wave-visible light conversion device having a nano-slit of a second shape different from the first shape (hereinafter, a second device) was used.

The first type of nano-slit may be a nano-slit having a nano-coax structure, and the second type of nano-slit may be a linear or striped nano-slit. The size of the nano-slits in the first and second devices was maintained as constant or substantially constant to about 100 nm. In addition, in the fourth experiment, the nano-slits of the first and second devices were all filled with the same light-emitting material (e.g., quantum dots).

The fourth experiment was performed in the order that terahertz waves were incident on the first and second devices, and visible light emitted from the light-emitting material filling the nano-slits of each device was measured. The intensity of the terahertz wave incident on the first and second devices was the same.

Figure 17:
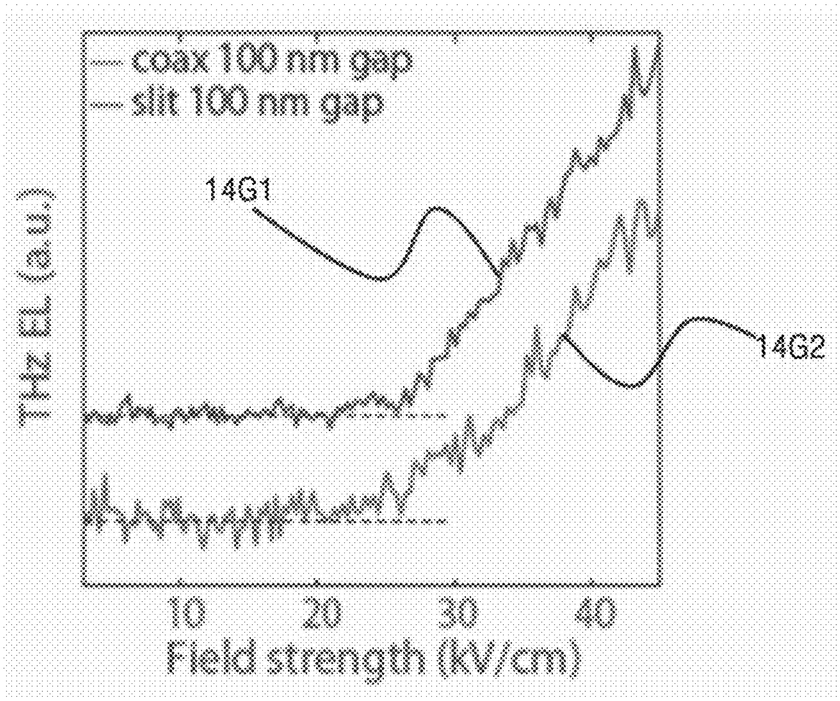
FIG. 17 is a graph showing results of a fourth experiment (experiment on the change of electroluminescence when the size of a nano-slit is the same and the shape of the nano-slit is different in the third experiment having the result of FIG. 16C)

FIG. 17 shows a result of the fourth experiment.

In FIG. 17, the horizontal axis represents the intensity of the incident terahertz wave, and the vertical axis represents the intensity of electroluminescence due to the terahertz wave (i.e., the intensity of the emitted visible light).

In FIG. 17, a first graph 14G1 shows a result of the fourth experiment for the first device including nano-slits of the nano-coax structure, and a second graph 14G2 shows a result of the fourth experiment for the second device including stripe-shaped nano-slits.

Comparing the first and second graphs 14G1 and 14G2 of FIG. 17 with each other, in a terahertz wave of a given intensity, the intensity of the electroluminescence of the second device is greater than the intensity of the electroluminescence of the first device. However, it may be seen that the threshold intensities of the terahertz waves causing the electroluminescence of the first and second devices are equal to or substantially equal to each other.

In FIG. 1, one through hole H1 and the second metal pattern 120B therein may be collectively referred to as a unit pattern. The unit pattern may be expressed as a pattern including one second metal pattern 120B and one gap surrounding the second metal pattern 120B and having a nano-coax structure.

In the unit pattern, the one second metal pattern 120B may be divided into a plurality of metal patterns. In other words, the one second metal pattern 120B may be configured to include a plurality of metal patterns separated from each other.

Figure 19:
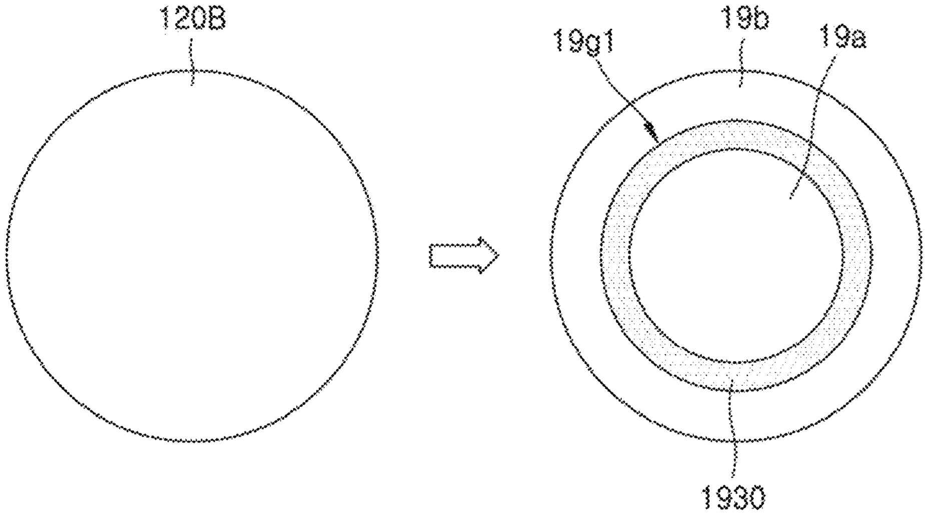
FIGS. 19 to 21 are plan views illustrating a case in which a second metal pattern includes a plurality of coax metal portions separated from each other in the first terahertz wave-visible light conversion device of FIG. 1.

For example, as shown in FIG. 19, the second metal pattern 120B may include a first metal portion 19*a*, a second metal portion 19*b*, a gap 19*g*1, and a light-emitting layer 1930 filling the gap 19*g*1. In an example embodiment, the planar shape of the first and second metal portions 19*a* and 19*b* may be circular, and may be concentric circles having the same center. The first metal portion 19*a* and the second metal portion 19*b* are separated from each other and do not directly contact each other. The gap 19*g*1 may be a cylindrical through hole positioned between the first metal portion 19*a* and the second metal portion 19*b* and completely surrounding the first metal portion 19*a*. The morphological relationship between the first and second metal portions 19*a* and 19*b* and the gap 19*g*1 may be expressed that a circular through hole exists in the first metal portion 19*a*, and the second metal portion 19*b* is formed in the circular through hole so as not to come into contact with the first metal portion 19*a*.

In some embodiments, materials of the first and second metal portions 19*a* and 19*b* may be the same or different from each other. For example, materials used for the first and second metal portions 19*a* and 19*b* may be the same or different from each other within a range of materials used for the second metal pattern 120B.

In some embodiments, dimensions and characteristics of the gap 19*g*1 may be the same as those of the gap 2*g*1 of FIG. 1, but the dimensions may be different from each other within a given range. A width of the gap 19*g*1 in a radial direction may be less than a radius of the first metal portion 19*a* and a width of the second metal portion 19*b*.

The gap 19*g*1 is filled with the light-emitting layer 1930. The gap 19*g*1 may be completely filled or may be partially filled with the light-emitting layer 1930. The degree of filling the gap 19*g*1 with the light-emitting layer 1930 may follow the example of filling the gap 2*g*1 with the light-emitting layer 130 described with reference to FIGS. 2 to 4.

An inner surface of the gap 19*g*1, that is, the inner surface of the cylindrical through hole existing between the first and second metal portions 19*a* and 19*b*, may be perpendicular to or substantially perpendicular to the substrate 110 like the side surface of the through hole H1 in FIG. 1, or may be an inclined surface like the side surface of the second through hole H2 of FIGS. 6A and 6B.

In some embodiments, a material and configuration of the light-emitting layer 1930 may follow the case of the light-emitting layer 130 described with reference to FIG. 1.

Figure 20:
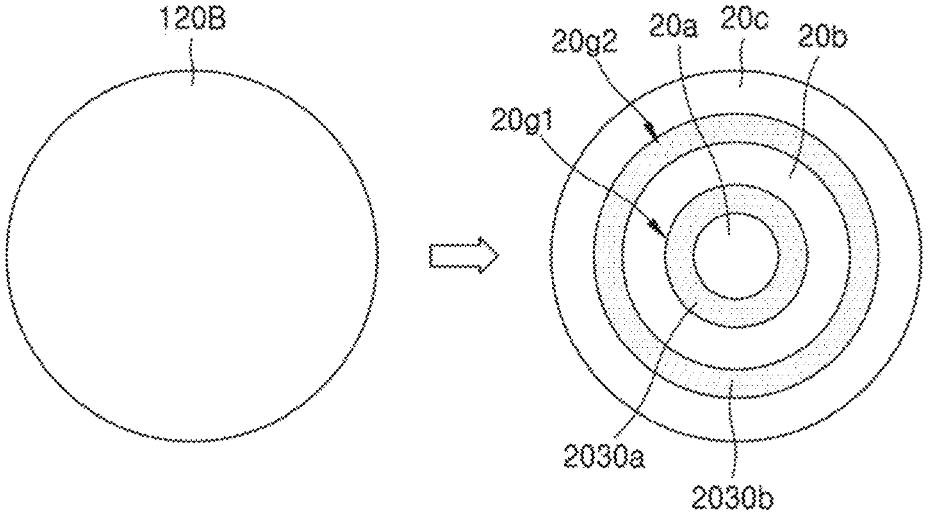

In some embodiments, for example, as shown in FIG. 20, the second metal pattern 120B may include first to third metal portions 20*a* to 20*c* having a circular planar shape, first and second gaps 20*g*1 and 20*g*2 having a circular planar shape, and first and second light-emitting layers 2030*a* and 2030*b* having a circular planar shape.

In some embodiments, the first to third metal portions 20*a* to 20*c* may be separated from each other and without contacting each other. A mutually spaced interval (distance) between the first to third metal portions 20*a* to 20*c* in a given direction may be the same, but may be different from each other.

The first metal portion 20*a* may be positioned inside the second metal portion 20*b*, and the second metal portion 20*b* may completely surround a circumference of the first metal portion 20*a*. The second metal portion 20*b* may be positioned inside the third metal portion 20*c*, and a circumference of the second metal portion 20*b* may be completely surrounded by the third metal part 20*c*. The second and third metal portions 20*b* and 20*c* may have a cylindrical shape having a given thickness in a radial direction. In some embodiments, the thickness of the second metal portion 20*b* in a radial direction may be the same as or different from the thickness of the third metal portion 20*c*. The thickness of the second metal portion 20*b* and/or the third metal portion 20*c* may be the same as or different from a diameter of the first metal portion 20*a*.

In some embodiments, a material of the first to third metal portions 20*a* to 20*c* may be the same as the material of the second metal pattern 120B. In some embodiments, materials used for the first to third metal portions 20*a* to 20*c* may be the same or different from each other within a range of materials used for the second metal pattern 120B.

A spacing interval between the first metal portion 20*a* and the second metal portion 20*b* may correspond to the first gap 20*g*1, and a spacing interval between the second metal portion 20*b* and the third metal portion 20*c* may corresponds to the second gap 20*g*2. Thicknesses of the first and second gaps 20*g*1 and 20*g*2 in the radial direction may be equal to each other. The thickness may be expressed as a width. A thickness in the radial direction of the first and second gaps 20*g*1 and 20*g*2 may be the same as a width of the gap 2*g*1 of FIG. 1. The thickness of the first gap 20*g*1 may be constant or substantially constant around the first metal portion 20*a*. The thickness of the second gap 20*g*2 may be constant or substantially constant around the second metal portion 20*b*.

The centers of the first to third metal portions 20*a* to 20*c* may be at the same position. Accordingly, the first to third metal portions 20*a* to 20*c* may be concentric circles. Accordingly, the first and second gaps 20*g*1 and 20*g*2 may also be concentric, and the thickness of the first and second gaps 20*g*1 and 20*g*2 may fall within a range of the width W1 of the gap 2*g*1 of FIG. 1. Accordingly, like the gap 2*g*1 of FIG. 1, the first and second gaps 20*g*1 and 20*g*2 may also be a ring-shaped nano-slit or a nano-slit having a nano-coax structure.

The first gap 20*g*1 may be filled with a first light-emitting layer 2030*a*, and the second gap 20*g*2 may be filled with a second light-emitting layer 2030*b*. The degree of filling the first gap 20*g*1 with the first light-emitting layer 2030*a* and the degree of filling the second gap 20*g*2 with the second light-emitting layer 2030*b* may follow the degree of filling the gap 2*g*1 with the light-emitting layer 130 described with reference to FIGS. 2 to 4.

Because the first and second light-emitting layers 2030*a* and 2030*b* may fill the first and second gaps 20*g*1 and 20*g*2, respectively, the first and second light-emitting layers 2030*a* and 2030*b* may also be concentric and have a nano-coax structure.

Materials of the first and second light-emitting layers 2030*a* and 2030*b* may be the same as or different from each other, and may be within a range of materials used as the light emitting layer 130 of FIG. 1.

Side surfaces of the first and second gaps 20*g*1 and 20*g*2 seen in a cross section of the first to third metal portions 20*a* to 20*c* in a direction perpendicular to the upper surface of the substrate 110 on which the first to third metal portions 20*a* to 20*c* are formed may be perpendicular to or substantially perpendicular to the upper surface of the substrate 110, but may be inclined surfaces like the side surfaces of the second through hole H2 shown in FIGS. 6 to 8.

The morphological relationship between the first to third metal portions 20*a* to 20*c* and the first and second gaps 20*g*1 and 20*g*2 may represent a structure in which a through hole (hereinafter, an outer through hole) through which the substrate 110 is exposed exists in the third metal portion 20*c*, the second metal portion 20*b* separated from the third metal portion 20*c* exists in the outer through hole, a through hole (hereinafter, an inner through hole) through which the substrate 110 is exposed exists in the second metal portion 20*b*, and the first metal portion 20*a* separated from the second metal portion 20*b* exists in the inner through hole. The centers of the first to third metal portions 20*a* to 20*c* and the centers of the inner and outer through holes may all be at the same position.

Figure 21:
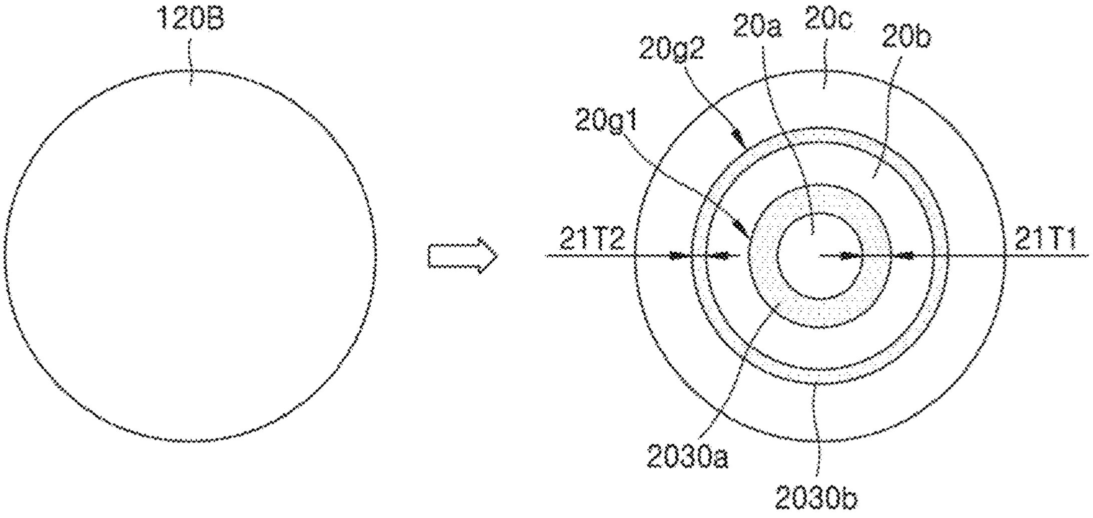

The thicknesses in the radial direction of the first and second gaps 20*g*1 and 20*g*2 may be constant or different from each other. For example, as shown in FIG. 21, a radial thickness 21T1 of the first gap 20*g*1 may be greater than a radial thickness 21T2 of the second gap 20*g*2, but conversely, the thickness 21T2 of the second gap 20*g*2 may be greater than the thickness 21T1 of the first gap 20*g*1. In this example, the width W1 of the gap 2*g*1 in FIG. 1 may be equal to the thickness of one of the first and second gaps 20*g*1 and 20*g*2, or may be different from the thicknesses 21T1 and 21T2 of the first and second gaps 20*g*1 and 20*g*2. As an example embodiment, the width W1 of the gap 2*g*1 may be the same as the thickness 21T2 of the second gap 20*g*2 and may be different from the thickness 21T1 of the first gap 20*g*1. In this example, the thicknesses in the radial direction of the second and third metal portions 20*b* and 20*c* may be the same or different from each other.

Figure 22:
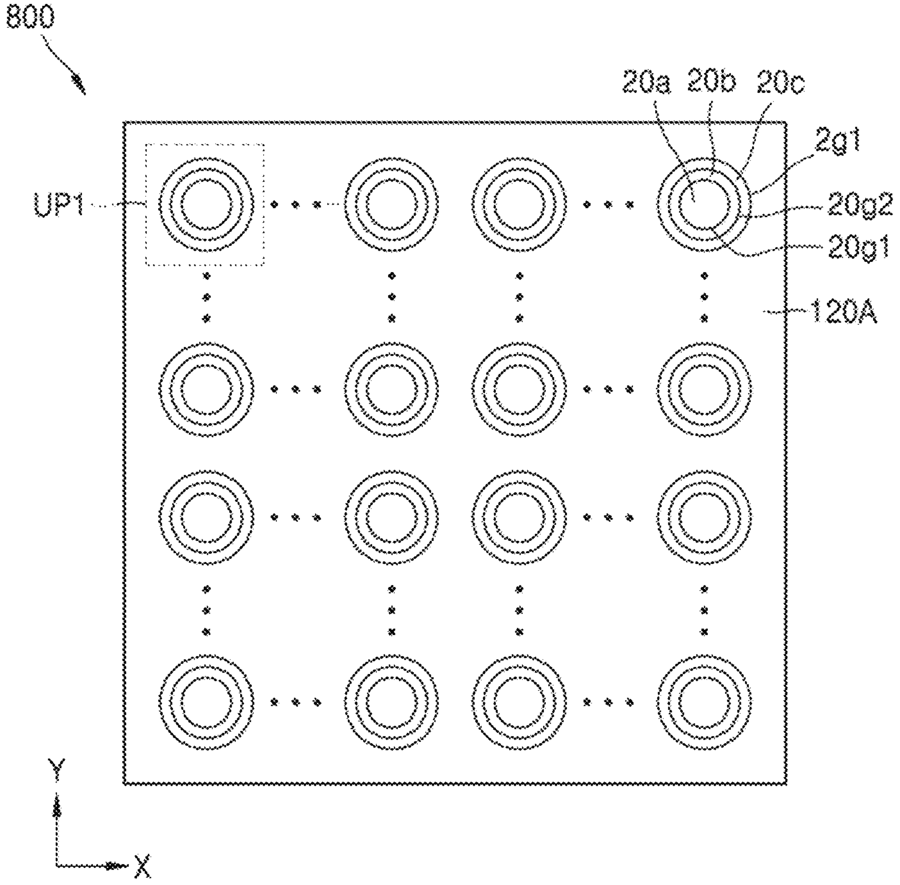
FIG. 22 is a plan view illustrating an eighth terahertz wave-visible light conversion device according to an embodiment.

FIG. 22 shows an eighth terahertz wave-visible light conversion device 800 according to an embodiment. In FIG. 22, a light-emitting layer is not shown for convenience of illustration.

The eighth terahertz wave-visible light conversion device 800 is a case in which the second metal pattern 120B inside the gap 2*g*1 in the first terahertz wave-visible light conversion device 100 of FIG. 1 is replaced by a metal pattern shown in FIG. 20.

In the first terahertz wave-visible light conversion device 100 of FIG. 1, the second metal pattern 120B may be replaced with the metal pattern illustrated in FIG. 19 or 21.

When the second metal pattern 120B in the first terahertz wave-visible light conversion device 100 of FIG. 1 is replaced with one of the metal patterns illustrated in FIGS. 19 to 21, in the first terahertz wave-visible light conversion device 100, a unit element or unit pattern constituting an array may include a plurality of nano-coax structures. Accordingly, the first terahertz wave-visible light conversion device 100 may be expressed as including a plurality of nano-coax structure arrays. The plurality of nano-coax structures have a ring shape and include a plurality of concentric nano-gaps, and thus, may be expressed as a plurality of coax rings.

In the eighth terahertz wave-visible light conversion device 800 illustrated in FIG. 22, the unit element (unit pattern) UP1 constituting an array may be replaced with various types of nano-coax structures. As an example embodiment, the unit element UP1 may be replaced with a spiral nano-coax structure shown in FIGS. 23A to 23D.

Figure 23A:
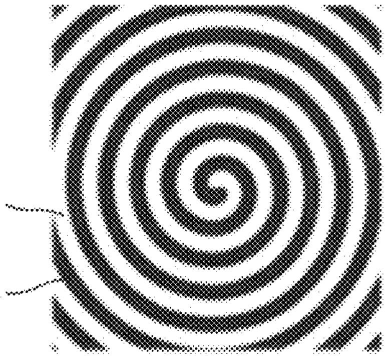
FIGS. 23A through 23D are plan views illustrating various spiral nano-coax structures capable of replacing unit elements (or unit patterns) of the eighth terahertz wave-visible light conversion device of FIG. 22.
Figure 23B:
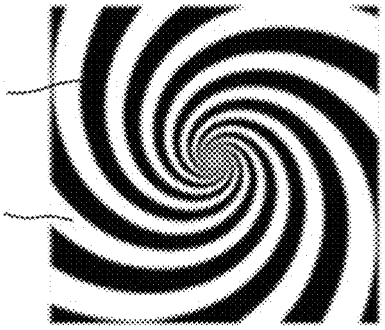
Figure 23C:
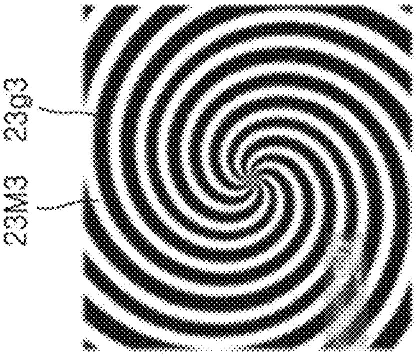
Figure 23D:
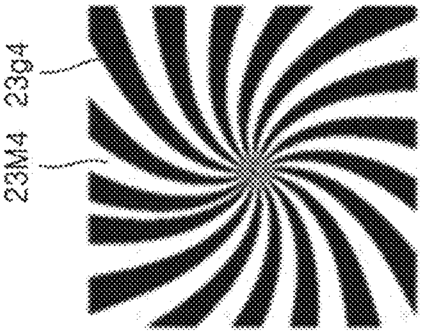

In all of the spiral nano-coax structures in FIGS. 23A to 23D, the metal pattern and the gap are spiral. In the case of the spiral nano-coax structure of FIG. 23A, a thickness of a metal pattern 23M1 and a gap 23*g*1 are constant or substantially constant. In the case of the spiral nano-coax structures in FIGS. 23B to 23D, the thickness of the spiral metal patterns 23M2 to 23M4 and the gaps 23*g*2 to 23*g*4 gradually decrease from the outside to the center of the spiral. The thickness changes of the metal patterns 23M2 and 23M4 and the gaps 23*g*2 and 23*g*4 of the spiral nano-coax structures in FIGS. 23B and 23D is greater than the thickness change of the metal pattern 23M3 and the gap 23*g*3 of the spiral nano-coax structure of FIG. 23C.

Because the light-emitting layer is filled in a gap, the positions of the gap and the light-emitting layer on a plane may be the same. Accordingly, in FIGS. 23A to 23D, reference numerals 23*g*1 to 23*g*4 indicating gaps may indicate a light-emitting layer.

Next, an image sensing device including the terahertz wave-visible light conversion device described above is described. An image sensing device, which will be described later, may be an image sensor, may detect a terahertz wave, and may also acquire information on a polarization state of the terahertz wave. Accordingly, the image sensing device to be described later may be viewed as a terahertz wave polarization detector or a polarization measuring device.

Figure 24:
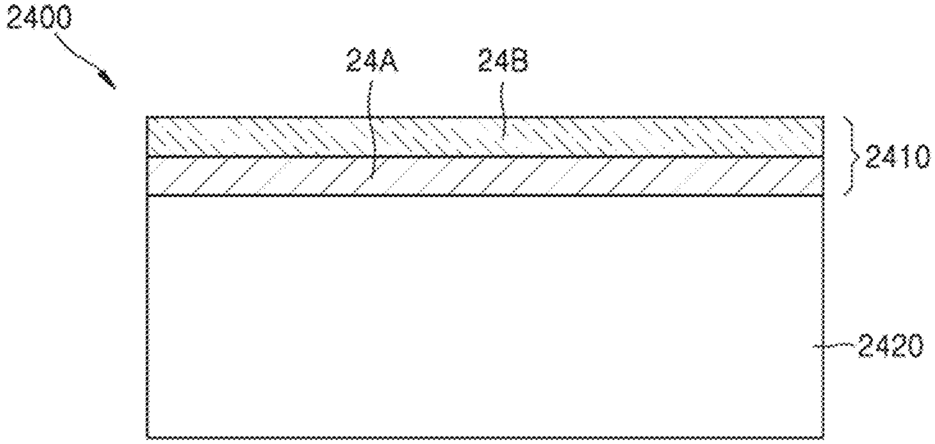
FIG. 24 is a cross-sectional view illustrating an image sensing device including a terahertz wave-visible light conversion device according to an embodiment.

FIG. 24 shows an image sensing device 2400 for detecting terahertz waves according to an embodiment.

Referring to FIG. 24, the image sensing device 2400 may include a terahertz wave-visible light conversion device 2410 and an image sensor 2420. The terahertz wave-visible light conversion device 2410 may include a substrate 24A and a visible light generating layer 24B. The substrate 24A may include the substrate 110 of FIG. 1. The visible light generating layer 24B may include metal patterns arranged to form a nano-gap and a light-emitting layer filling the nano-gap. In an example embodiment, the visible light generating layer 24B may be a layer structure formed on the substrate 110 of any one of the above-described first to eighth terahertz wave-visible light conversion devices 100, 200, 300, 400, 500, 600, 700, and 800, or may include the layer structure. For example, the layer structure may include the first and second metal patterns 120A and 120B aligned to form the gap 2*g*1 of FIG. 1 and the light-emitting layer 130 filling the gap 2*g*1.

The terahertz wave-visible light conversion device 2410 may be provided on the light incident side of the image sensor 2420, but is not limited thereto. The terahertz wave-visible light conversion device 2410 may be one of the various terahertz wave-visible light conversion devices described above, for example, the first to eighth terahertz wave-visible light conversion devices 100, 200, 300, 400, 500, 600, 700, and 800.

In some embodiments, the terahertz wave-visible light conversion device 2410 may be configured by combining two or more of the first to eighth terahertz wave-visible light conversion devices 100, 200, 300, 400, 500, 600, 700, 800. This will be described later.

The image sensor 2420 may be a device for sensing visible light emitted from the terahertz wave-visible light conversion device 2410. Visible light emitted from the terahertz wave-visible light conversion device 2410 may include information about the intensity of the terahertz wave and information about the polarization state as described in the experimental results of FIG. 16. Accordingly, by receiving visible light emitted from the terahertz wave-visible light conversion element 2410 using the image sensor 2420, the intensity and polarization state of the terahertz wave may be seen.

As it may be seen from the experimental results of FIG. 16, when a terahertz wave is incident on the terahertz wave-visible light conversion device 2410, a field enhancement phenomenon is strongly occurs in a gap aligned perpendicular to a linear polarization direction of the terahertz wave, and, due to this phenomenon, visible light is emitted from the light-emitting layer filling the gap. Because the field enhancement phenomenon does not occur in the gap portion parallel to the linear polarization direction of the terahertz wave, visible light is not emitted from the light-emitting layer filled in the gap portion parallel to the linear polarization direction of the terahertz wave.

Accordingly, a region of the terahertz wave-visible light conversion device 2410, from which visible light is emitted, may be limited according to a polarization state of a terahertz wave incident on the terahertz wave-visible light conversion device 2410. Therefore, the intensity and polarization state of the terahertz wave incident on the terahertz wave-visible light conversion device 2410 may be seen by measuring the visible light emitted from the terahertz wave-visible light conversion device 2410 with the image sensor 2420. The visible light measurement may denote measuring an image of a region of the terahertz wave-visible light conversion device 2410, where visible light is emitted.

In some embodiments, the image sensor 2420 may include an image sensor such as a charge coupled device (CCD) or a CMOS image sensor (CIS).

Figure 25:
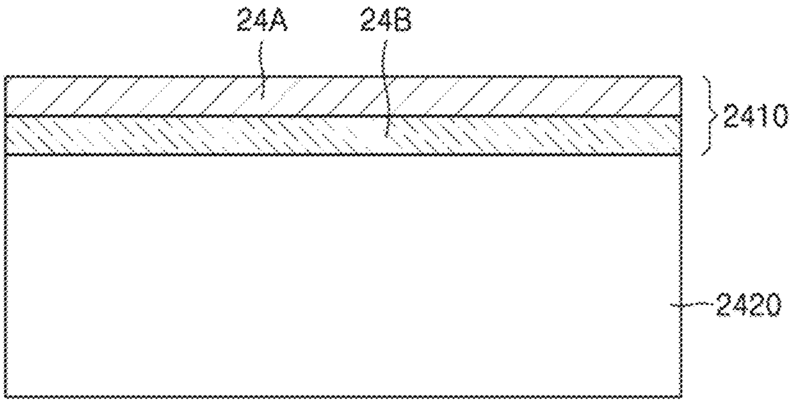
FIG. 25 is a cross-sectional view illustrating a case in which the terahertz wave-visible light conversion device in FIG. 24 is inverted.

Because the substrate 24A is transparent to terahertz waves and visible light, as shown in FIG. 25, the terahertz wave-visible light conversion device 2410 may be provided so that the visible light generating layer 24B faces the image sensor 2420 and is in direct contact with the 2420.

Figure 26:
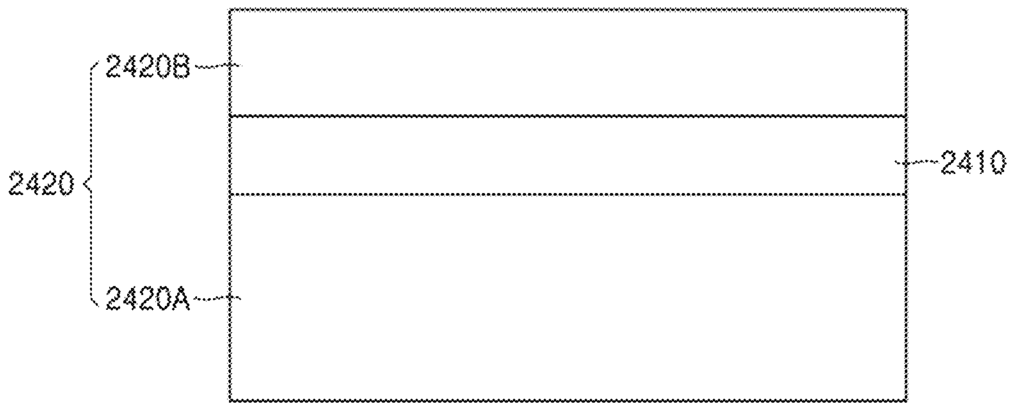
FIG. 26 is a cross-sectional view illustrating a case in which a terahertz wave-visible light conversion device is disposed between sequentially stacked layers of an image sensor in the image sensing device of FIG. 24.

The terahertz wave-visible light conversion device 2410 may be disposed between components included in the image sensor 2420, for example, as shown in FIG. 26, between a first portion 2420A and a second portion 2420B of the image sensor 2420. In some embodiments, the second portion 2420B may be or include a lens layer or a lens array. In an example embodiment, the lens layer may include a glass lens, a plastic lens, or a metal lens. In some embodiments, the first portion 2420A may include a remaining portion of the image sensor 2420 excluding the lens layer.

In the case of FIG. 26, the terahertz wave-visible light conversion device 2410 may have a structure as illustrated in FIG. 24 or 25.

Figure 27:
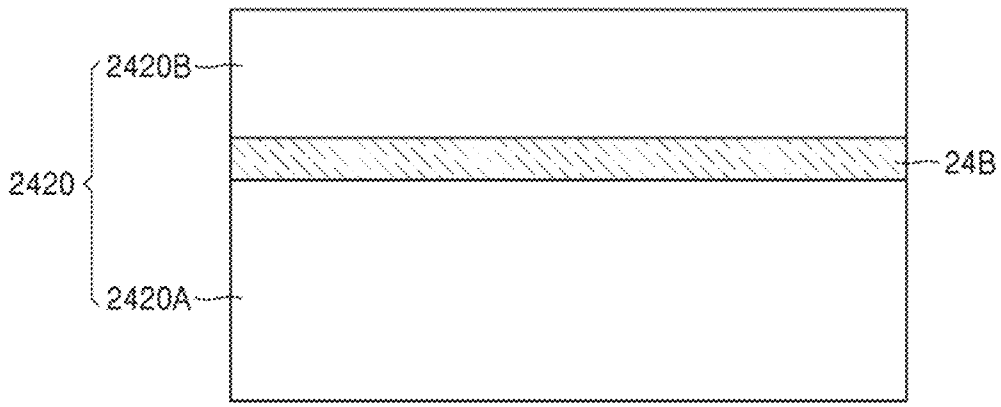
FIG. 27 is a cross-sectional view illustrating a case in which only the visible light-emitting layer is disposed between sequentially stacked layers of the image sensor in the case of FIG. 26.

Also, in the structure illustrated in FIG. 26, the substrate 24A of the terahertz wave-visible light conversion device 2410 may be omitted. That is, as shown in FIG. 27, only the visible light generating layer 24B of the terahertz wave-visible light conversion device 2410 may be provided between the first portion 2420A and the second portion 2420B of the image sensor 2420. The visible light generating layer 24B may be formed as part of a process of manufacturing the image sensor 2420.

In some embodiments, in the image sensing device 2400 illustrated in FIGS. 24 to 27, the arrangement of the metal pattern and the gap included in the visible light generating layer 24B of the terahertz wave-visible light conversion device 2410 may be the same as the arrangement of the metal pattern and the gap illustrated in FIG. 9, 11, 12 or 13. In this case, the image sensing device 2400 illustrated in FIGS. 24 to 27 may be a polarization detector that detects terahertz waves linearly polarized in a specific direction. For example, when the metal pattern and the gap included in the visible light generating layer 24B of the terahertz wave-visible light conversion device 2410 of the image sensing device 2400 are arranged in the horizontal direction (e.g., direction parallel to the x-axis) as the metal pattern 820 and the gap 8*g*1 illustrated in FIG. 11, the image sensing device 2400 may be a polarization detector that detects only terahertz waves polarized in the vertical direction (e.g., direction parallel to the y-axis).

Figure 28:
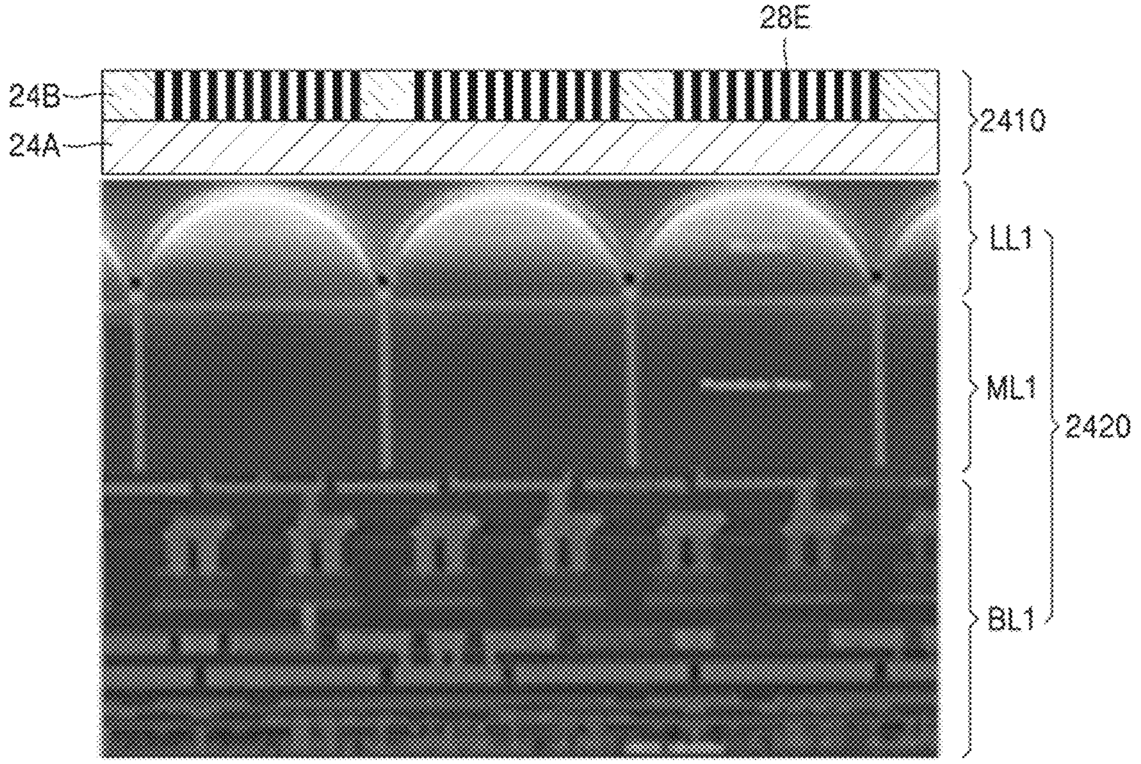
FIG. 28 is a cross-sectional image illustrating an example of a combination of an actual image sensor capable of sensing visible light (photo) and a terahertz wave-visible light conversion device (picture)

FIG. 28 shows an example of a combination of an actual image sensor 2820 and a terahertz wave-visible light conversion device 2410. In FIG. 28, reference numeral BL1 may denote a circuit unit of the image sensor 2420 and may denote ROIC, ML1 denotes a layer including a stacked filter layer and a photoelectric conversion layer, and LL1 denotes a lens layer. The lens layer LL1 includes a convex glass or plastic lens array, but may be replaced with a flat meta lens. Reference numeral 28E schematically denotes a light-emitting layer filling nano-slits formed in the visible light generating layer 24B.

Figure 29:
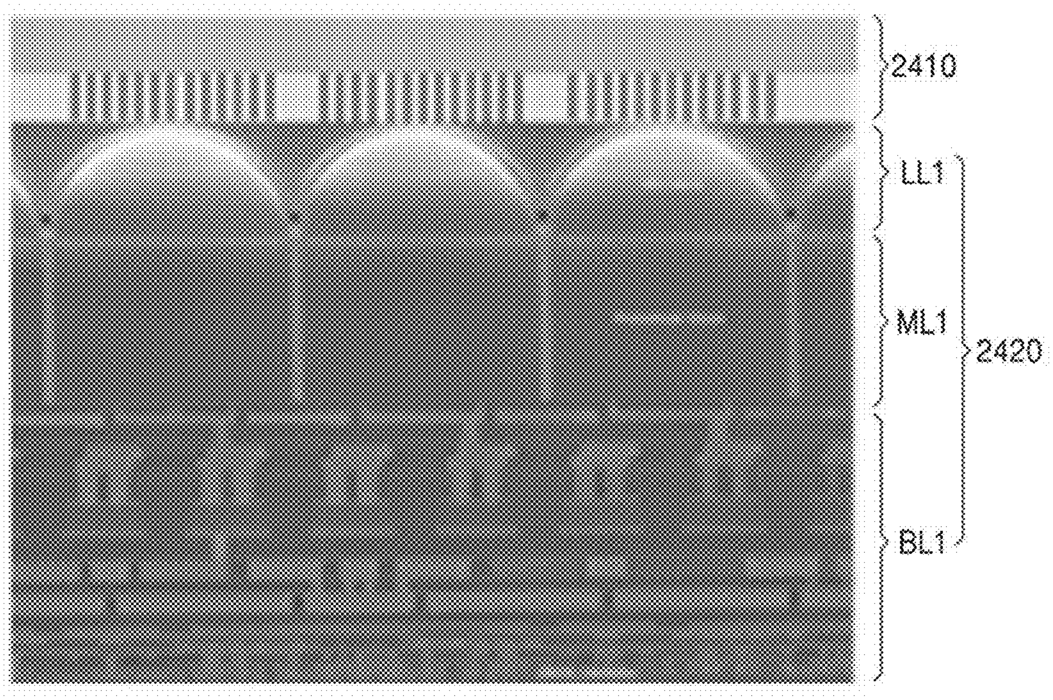
FIG. 29 is a cross-sectional image illustrating a case in which the terahertz wave-visible light conversion device may be provided in an upside down form.

FIG. 28 may correspond to an example of the image sensing device 2400 shown in FIG. 24. In FIG. 29, the terahertz wave-visible light conversion device 2410 may be provided in an upside down form. That is, in FIG. 29, in the terahertz wave-visible light conversion device 2410, as shown in FIG. 25, the visible light generating layer 24B may be provided to directly face the image sensor 2420 by positioning the substrate 24A above and positioning the visible light generating layer 24B below the substrate 24A.

Figure 30:
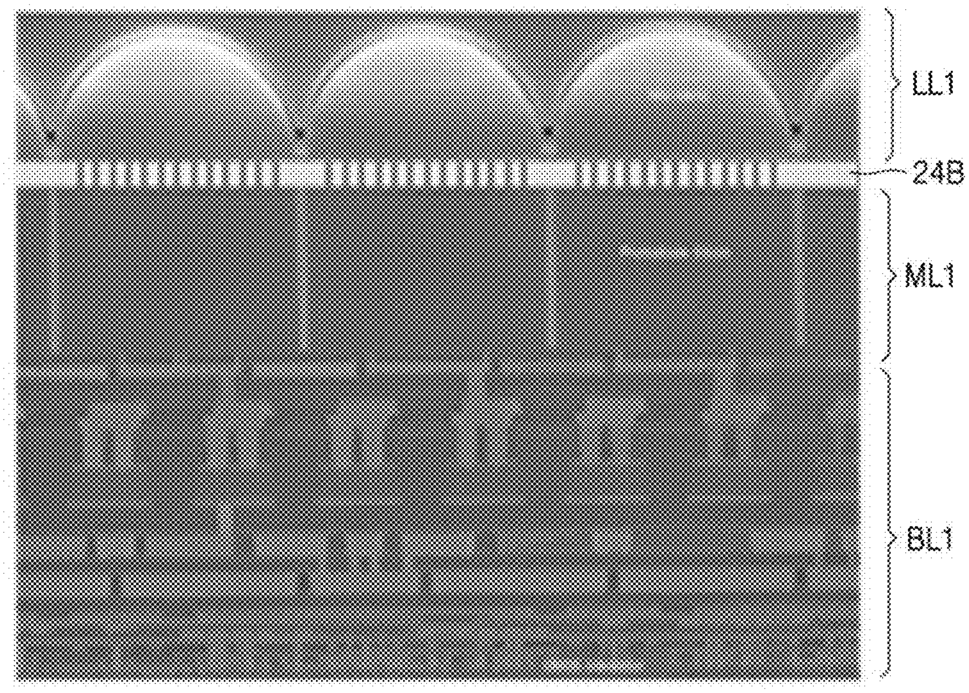
FIG. 30 is a cross-sectional image illustrating a case in which the terahertz wave-visible light conversion device may be provided between elements constituting the image sensor.

In addition, in FIG. 30, the terahertz wave-visible light conversion device 24B may be provided between elements constituting the image sensor 24A, for example, between a layer ML1 in which a photoelectric conversion layer and a filter layer are included and the lens layer LL1. When the terahertz wave-visible light conversion device 24B is provided in this way, as illustrated in FIG. 27, the substrate 24A may be omitted and only the visible light generating layer 24B may be formed between the layer ML1 and the lens layer LL1.

Figure 31:
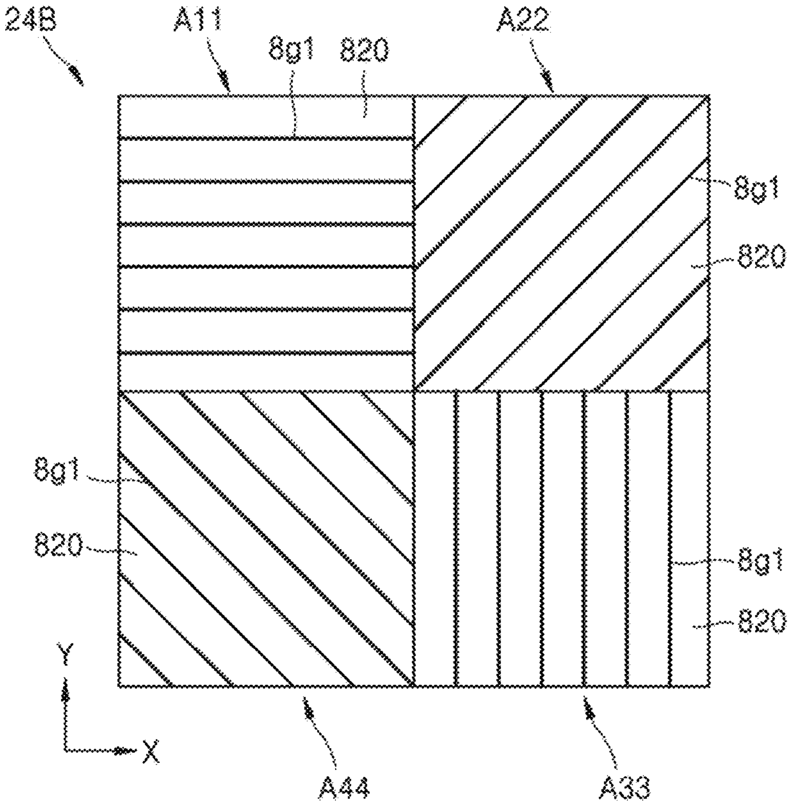
FIG. 31 is a plan view illustrating a case in which four types of terahertz wave-visible light conversion devices that react differently to polarized terahertz waves are included in an image sensing device shown in FIGS. 24 to 27 to form one pixel, or a case in which a visible light-emitting layer included in the image sensing device shown in FIGS. 24 to 27 includes four types of visible light-emitting layers that react differently to polarized terahertz waves

In some embodiments, as shown in FIG. 31, the visible light generating layer 24B may include first to fourth portions A11, A22, A33, and A44, in which alignment shapes of a metal pattern and a gap are different from each other. Each of the first to fourth portions A11, A22, A33, and A44 may be a nano-slit in which only the alignment direction of the gap is different from each other.

Referring to FIG. 31, the visible light generating layer 24B may include the first portion A11 in which a metal pattern 820 and a gap 8$g$1 are aligned in a horizontal direction (a direction parallel to the x-axis), the second portion A22 in which the metal pattern 820 and the gap 8$g$1 are inclined at an acute angle (e.g., +45°) with respect to the x-axis, the third portion A33 in which the metal pattern 820 and the gap 8$g$1 are aligned in a vertical direction (a direction parallel to the y-axis), and the fourth portion A44 in which the metal pattern 820 and the gap 8$g$1 are inclined at an obtuse angle (e.g., +135°) with respect to the x-axis. The metal pattern 820 of the second portion A22 and the fourth portion A44 may be perpendicular to each other, and the gap 8$g$1 may also be perpendicular to each other.

Considering the alignment directions of the metal pattern 820 and the gap 8$g$1 of each of the first to fourth portions A11, A22, A33, and A44, the first portion A11 may be a nano-slit for detecting a vertically polarized terahertz wave, the second portion A22 may be a nano-slit for detecting terahertz wave polarized at an obtuse angle (e.g., 135°) with respect to the x-axis, the third portion A33 may be a nano-slit for detecting a horizontally polarized terahertz wave, and the fourth portion A44 may be a nano-slit for detecting a terahertz wave polarized at an acute angle (e.g., 45°) with respect to the x-axis.

As a result, the visible light generating layer 24B including the first to fourth portions A11, A22, A33, and A44 may be used to detect terahertz waves having linear polarization angles of 0°, 45°, 90°, and 135°.

The first to fourth portions A11, A22, A33, and A44 may form one pixel for measurement of polarized light. The pixel may correspond to one of the pixels included in the image sensor 24A.

The visible light generating layer 24B may include a plurality of pixels for measurement of polarized light. Accordingly, the visible light generating layer 24B may be expressed as a pixel layer for measurement of polarized light.

Stoke vectors for the first to fourth portions A11, A22, A33, and A44 constituting one pixel may be calculated to obtain the degree of linear polarization (DoLP) of a terahertz wave and angle of linear polarization (AoLP) may be measured, and may be directly imaged through the image sensor 2420.

In traditionally used conventional methods, it was inconvenient and cumbersome because the polarizing plate had to be rotated to secure a polarization angle. However, in the case of the illustrated image sensing device 2400, a polarization state of the terahertz wave may be directly imaged by using the visible light generating layer 24B.

The DoLP and the AoLP of a terahertz wave incident on the first to fourth portions A11, A22, A33, and A44 of the visible light generating layer 24B may be calculated by the following Equations 1 and 2, respectively.

$$DoLP = \left[(S_1)^2 + (S_2)^2\right]^{1/2}/S_0. \qquad \text{Equation 1}$$

$$AoLP = 1/2\arctan\left(S_2/S_1\right). \qquad \text{Equation 2}$$

In Equations 1 and 2, $S_1$, $S_2$, and $S_0$ may be obtained from the following Stokes vectors S for the first to fourth portions A11, A22, A33, and A4 forming a pixel.

$$S = \begin{bmatrix} S_0 \\ S_1 \\ S_2 \\ S_3 \end{bmatrix} = \begin{bmatrix} I_0 + I_{90} \\ I_0 - I_{90} \\ I_{45} + I_{135} \\ I_{LHC} + I_{RHC} \end{bmatrix} \qquad \text{Stoke Vector}$$

In the above Stokes vector, $I_0$ denotes the intensity of a terahertz wave having a linear polarization angle of 0°, and $I_{90}$ denotes an intensity of a terahertz wave having a linear polarization angle of 90°. $I_{45}$ denotes the intensity of a terahertz wave having a linear polarization angle of 45°, and $I_{135}$ denotes an intensity of a terahertz wave having a linear polarization angle of 135°. $I_{LHC}$ represents the intensity of a terahertz wave having left-handed polarization, and $I_{RHC}$ represents the intensity of a terahertz wave having right-handed polarization.

Considering the Stoke vector and Equations 1 and 2, by measuring the intensities according to the polarization state of the terahertz wave incident on the visible light generating layer 24B, the DoLP and the AoLP of the incident terahertz wave may be calculated.

In the light conversion device for detecting a terahertz wave according to an embodiment, a plurality of metal patterns are arranged to form nano-slits (gaps), the nano-slits have a width at which a field enhancement strongly occurs according to the polarization state of an incident terahertz wave, and the nano-slit is filled with a light-emitting layer that emits visible light due to the field enhancement. Accordingly, even when a terahertz wave having very small photon energy is incident, visible light may be emitted from the light-emitting layer by a field enhancement. Thus, when a light conversion device according to an embodiment is used, high sensitivity to a terahertz wave may be secured.

In addition, in the case of the disclosed light conversion device, an emission region of visible light may vary according to a polarization state of a terahertz wave. Therefore, by combining the disclosed light conversion device with a visible light image sensor, information on a polarization state (e.g., polarization intensity, polarization angle) of an incident terahertz wave may be readily obtained, and the information may be directly imaged.

In addition, the detection of a terahertz wave using the disclosed device may be performed at atmospheric pressure and room temperature, and thus, it may be free from an environment in which temperature and pressure are extremely limited.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light conversion device comprising:

a substrate;

a plurality of metal patterns provided on the substrate and separated from each other;

a metal layer provided on the substrate and surrounding each of the plurality of metal patterns;

a first slit positioned between the metal layer and each of the plurality of metal patterns and surrounding each of the plurality of metal patterns; and a light-emitting layer filling the first slit, wherein the substrate comprises a glass substrate or a quartz substrate, wherein the first slit and each of the plurality of metal patterns surrounded by the first slit are concentric, wherein the metal layer and the plurality of metal patterns are aligned so that a first electric field enhancement occurs only at a portion of the first slit when a wave belonging to an invisible light band is incident to the first slit, wherein the first slit defines a side surface inclined with respect to the substrate, wherein the side surface comprises two side surfaces inclined with respect to the substrate and the two side surfaces are separated from each other and symmetrically provided, wherein an upper surface of the light-emitting layer is lower than an upper surface of the metal layer and an upper surface of each the plurality of metal patterns, wherein each of the plurality of metal patterns is arranged to form a second slit configured to generate second electric field enhancement only at a portion of the second slit when the wave of the invisible light band is incident to the second slit, and comprises a first metal portion and a second metal portion, wherein the wave is a terahertz wave that is polarized in a direction perpendicular to the portion of the first slit and the portion of the second slit, wherein the second slit is between the first metal portion and the second metal portion, is concentric with the first slit, and is partially filled with the light-emitting layer, and wherein the light-emitting layer comprises a quantum dot (QD) layer to convert the wave incident to the QD layer to visible light, and wherein a first width of the first slit and a second width of the second slit are different from each other to detect intensity of the wave.

2. The light conversion device of claim 1, wherein the light-emitting layer comprises at least one of quantum dots or an organic light-emitting diode (OLED) material.

3. The light conversion device of claim 1:

wherein the second metal portion completely surrounds the first metal portion.

4. The light conversion device of claim 3, wherein the second slit defines a side surface substantially perpendicular or inclined with respect to the substrate.

5. The light conversion device of claim 1, wherein each of the plurality of metal patterns (i) is arranged to form a third slit in which a third electric field enhancement occur when the wave of the invisible light band is incident to the third slit, and (ii) includes a third metal portion separated from the first metal portion and the second metal portion, wherein the first metal portion, the second metal portion, and the third metal portion are concentric circles and are sequentially provided in a radial direction, wherein the third slit is positioned between the second metal portion and the third metal portion; and wherein the third slit (i) is partially filled with the light-emitting layer and (ii) has a third width configured to generate visible light from the light-emitting layer by the third electric field enhancement.

6. The light conversion device of claim 5, wherein the first slit and the third slit or the second slit and the third slit have a same width as each other.

7. The light conversion device of claim 5, wherein the third width is different from at least one of the first width and the second width.

8. The light conversion device of claim 5, wherein the second slit and the third slit each define a side surface substantially perpendicular to or inclined to the substrate.

9. A light conversion device comprising:

a substrate;

a first metal layer formed on the substrate and including a plurality of first through holes separated from each other;

a second metal layer provided in the plurality of first through holes and separated from the first metal layer; and a light-emitting layer filling a first gap between the first metal layer and the second metal layer, wherein the substrate comprises a glass substrate or a quartz substrate, wherein the first gap has a first width configured to generate a first electric field enhancement only at a portion of the first gap according to a polarization state of a wave when the wave belonging to an invisible light band is incident, wherein a side surface of the first metal layer and a side surface of the second metal layer each defined by the first gap are inclined with respect to the substrate, wherein the side surface comprises two side surfaces inclined with respect to the substrate and the two side surfaces are separated from each other and symmetrically provided, wherein an upper surface of the light-emitting layer is lower than an upper surface of the first metal layer and an upper surface of the second metal layer, wherein the second metal layer includes:

a second through hole through which the substrate is exposed; and a third metal layer formed on the substrate in the second through hole and separated from the second metal layer, wherein a second gap between the second metal layer and the third metal layer is partially filled with the light-emitting layer, wherein the second gap has a second width configured to generate a second electric field enhancement only at a portion of the second gap according to the polarization state of the wave when the wave is incident, wherein the first width and the second width are different from each other to detect intensity of the wave, wherein the wave is a terahertz wave that is polarized in a direction perpendicular to the portion of the first gap and the portion of the second gap, and wherein the light-emitting layer comprises a quantum dot (QD) layer to convert the wave incident to the QD layer to visible light.

10. The light conversion device of claim 9, wherein the light-emitting layer extends onto the first metal layer, the second metal layer and the third metal layer.

11. The light conversion device of claim 9, wherein the third metal layer includes:

a third through hole through which the substrate is exposed; and a fourth metal layer formed on the substrate in the third through hole and separated from the third metal layer, wherein a third gap between the third metal layer and the fourth metal layer is partially filled with the light-emitting layer, and wherein the third gap has a third width configured to generate a third electric field enhancement according to the polarization state of the wave when the wave is incident.

12. An image sensing device comprising:

a light conversion device comprising:

a substrate;

a plurality of metal patterns provided on the substrate and separated from each other;

a metal layer provided on the substrate and surrounding each of the plurality of metal patterns;

a first slit positioned between the metal layer and each of the plurality of metal patterns and surrounding each of the plurality of metal patterns; and a light-emitting layer filling the first slit; and an image sensor configured to sense visible light emitted from the light conversion device, the image sensor being in contact with the substrate, wherein the substrate comprises a glass substrate or a quartz substrate, wherein the first slit and each of the plurality of metal patterns surrounded by the first slit are concentric, wherein the metal layer and the plurality of metal patterns are aligned so that a first electric field enhancement occurs only at a portion of the first slit when a wave belonging to an invisible light band is incident to the first slit, wherein the first slit defines a side surface inclined with respect to the substrate, wherein the side surface comprises two side surfaces inclined with respect to the substrate and the two side surfaces are separated from each other and symmetrically provided, wherein an upper surface of the light-emitting layer is lower than an upper surface of the metal layer and an upper surface of each the plurality of metal patterns, wherein the image sensing device is used to detect a polarization state of the wave and intensity of the wave, wherein each of the plurality of metal patterns is arranged to form a second slit configured to generate second electric field enhancement only at a portion of the second slit when the wave of the invisible light band is incident to the second slit, and comprises a first metal portion and a second metal portion, wherein the wave is a terahertz wave that is polarized in a direction perpendicular to the portion of the first slit and the portion of the second slit, wherein the second slit is between the first metal portion and the second metal portion, is concentric with the first slit, and is partially filled with the light-emitting layer, wherein the light-emitting layer comprises a quantum dot (QD) layer to convert the wave incident to the QD layer to visible light, and wherein a first width of the first slit and a second width of the second slit are different from each other to detect intensity of the wave.

* * * * *